US012777653B2

(12) United States Patent
Park et al.

(10) Patent No.: US 12,777,653 B2
(45) Date of Patent: Oct. 27, 2026

(54) SEMICONDUCTOR DEVICE, METHOD FOR MANUFACTURING THE SAME, AND ELECTRONIC SYSTEM INCLUDING SEMICONDUCTOR DEVICE

(71) Applicant: SAMSUNG ELECTRONICS CO., LTD., Suwon-si (KR)

(72) Inventors: Wonjun Park, Suwon-si (KR); Byongju Kim, Suwon-si (KR); Jaemin Jung, Suwon-si (KR); Kwangmin Park, Suwon-si (KR); Donghwa Lee, Suwon-si (KR); Dongsung Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 363 days.

(21) Appl. No.: 18/236,637

(22) Filed: Aug. 22, 2023

(65) Prior Publication Data

US 2024/0244846 A1 Jul. 18, 2024

(30) Foreign Application Priority Data

Jan. 17, 2023 (KR) ........................ 10-2023-0006962

(51) Int. Cl.

| | |
|---|---|
| ***H10B 41/27*** | (2023.01) |
| ***H10B 41/35*** | (2023.01) |
| ***H10B 41/40*** | (2023.01) |
| ***H10B 43/27*** | (2023.01) |
| ***H10B 43/35*** | (2023.01) |
| ***H10B 43/40*** | (2023.01) |

(52) U.S. Cl.
CPC ............ *H10B 43/35* (2023.02); *H10B 41/27* (2023.02); *H10B 41/35* (2023.02); *H10B 41/40* (2023.02); *H10B 43/27* (2023.02); *H10B 43/40* (2023.02)

(58) Field of Classification Search
None
See application file for complete search history.

(56) References Cited

U.S. PATENT DOCUMENTS

| | | | | |
|---|---|---|---|---|
| 8,461,000 | B2 | 6/2013 | Alsmeier et al. | |
| 9,831,118 | B1 | 11/2017 | Pang et al. | |
| 10,804,282 | B2 | 10/2020 | Baraskar et al. | |
| 11,158,649 | B2 | 10/2021 | Sotome et al. | |
| 2017/0345705 | A1* | 11/2017 | Pang | H01L 23/5329 |
| 2019/0172906 | A1* | 6/2019 | Kim | H10B 43/27 |
| 2020/0194441 | A1* | 6/2020 | Kwon | H10B 43/27 |

(Continued)

FOREIGN PATENT DOCUMENTS

KR 1020220143787 A 12/2022

*Primary Examiner* — Sue A Purvis
*Assistant Examiner* — Seyon Ali-Simah Punchbeddell
(74) *Attorney, Agent, or Firm* — Muir Patent Law, PLLC

(57) ABSTRACT

A semiconductor device includes a substrate; a stack structure including an interlayer insulating layer and a gate electrode which are alternately stacked on the substrate; a channel layer extending in a direction crossing the substrate through the stack structure; and a gate dielectric layer between the gate electrode and the channel layer, the gate dielectric layer including a tunneling layer, a charge storage layer, and a blocking layer sequentially on the channel layer, wherein the tunneling layer includes a carbon-containing layer including carbon, and the tunneling layer is positioned closer to the channel layer than it is to the charge storage layer.

20 Claims, 24 Drawing Sheets

(56) References Cited

U.S. PATENT DOCUMENTS

| | | | | |
|---|---|---|---|---|
| 2020/0235122 | A1* | 7/2020 | Kang | H10D 64/037 |
| 2020/0273880 | A1* | 8/2020 | Sotome | H01L 23/481 |
| 2021/0399000 | A1 | 12/2021 | Wang et al. | |
| 2022/0005826 | A1* | 1/2022 | Lim | H10B 41/27 |
| 2022/0102513 | A1 | 3/2022 | Bin et al. | |
| 2022/0149074 | A1 | 5/2022 | Kim | |
| 2023/0005864 | A1* | 1/2023 | Yang | H10B 43/40 |

* cited by examiner

SEMICONDUCTOR DEVICE, METHOD FOR MANUFACTURING THE SAME, AND ELECTRONIC SYSTEM INCLUDING SEMICONDUCTOR DEVICE

CROSS-REFERENCE TO RELATED APPLICATION

This application claims priority to and the benefit of Korean Patent Application No. 10-2023-0006962, filed in the Korean Intellectual Property Office on Jan. 17, 2023, the entire contents of which are incorporated herein by reference.

BACKGROUND

1 Field

Embodiments relate to a semiconductor device, a manufacturing method thereof, and an electronic system including the semiconductor device.

2. Description of the Related Art

In an electronic system implementing data storage, a semiconductor device may be capable of storing high-capacity data. Accordingly, a method for increasing data storage capacity of a semiconductor device is being researched. One method for increasing the data storage capacity of a semiconductor device may include a semiconductor device including three-dimensionally arranged memory cells instead of two-dimensionally arranged memory cells.

SUMMARY

The embodiments may be realized by providing a semiconductor device including a substrate; a stack structure including an interlayer insulating layer and a gate electrode which are alternately stacked on the substrate; a channel layer extending in a direction crossing the substrate through the stack structure; and a gate dielectric layer between the gate electrode and the channel layer, the gate dielectric layer including a tunneling layer, a charge storage layer, and a blocking layer sequentially on the channel layer, wherein the tunneling layer includes a carbon-containing layer including carbon, and the tunneling layer is positioned closer to the channel layer than it is to the charge storage layer.

The embodiments may be realized by providing a semiconductor device including a main substrate; a semiconductor device on the main substrate; and a controller electrically connected to the semiconductor device on the main substrate, wherein the semiconductor device includes a circuit region including a peripheral circuit structure on a first substrate and a cell region including a memory cell structure on a second substrate, the cell region includes a stack structure including an interlayer insulating layer and a gate electrode which are alternately stacked on the second substrate, a channel layer extending through the stack structure and extending in a direction crossing the second substrate, and a gate dielectric layer between the gate electrode and the channel layer to include a tunneling layer, a charge storage layer, and a blocking layer sequentially disposed on the channel layer, and the tunneling layer includes a carbon-containing layer including carbon, the tunneling layer being closer to the channel layer than to the charge storage layer.

The embodiments may be realized by providing a manufacturing method of a semiconductor device including a stack structure including an interlayer insulating layer and a gate electrode which are alternately stacked on a substrate, a channel layer extending through the stack structure and extending in a direction crossing the substrate, and a gate dielectric layer between the gate electrode and the channel layer, the gate dielectric layer including a tunneling layer, a charge storage layer, and a blocking layer sequentially on the channel layer, the method including forming the tunneling layer such that forming the tunneling layer includes forming a carbon-containing layer that includes carbon and is closer to the channel layer than to the charge storage layer.

BRIEF DESCRIPTION OF THE DRAWINGS

Features will be apparent to those of skill in the art by describing in detail exemplary embodiments with reference to the attached drawings in which.

DETAILED DESCRIPTION

Hereinafter, a semiconductor device and a manufacturing method thereof according to an embodiment will be described in detail with reference to FIG. 1 to FIG. 4B, FIG. 5A to FIG. 5E, and FIG. 6.

Figure 1:
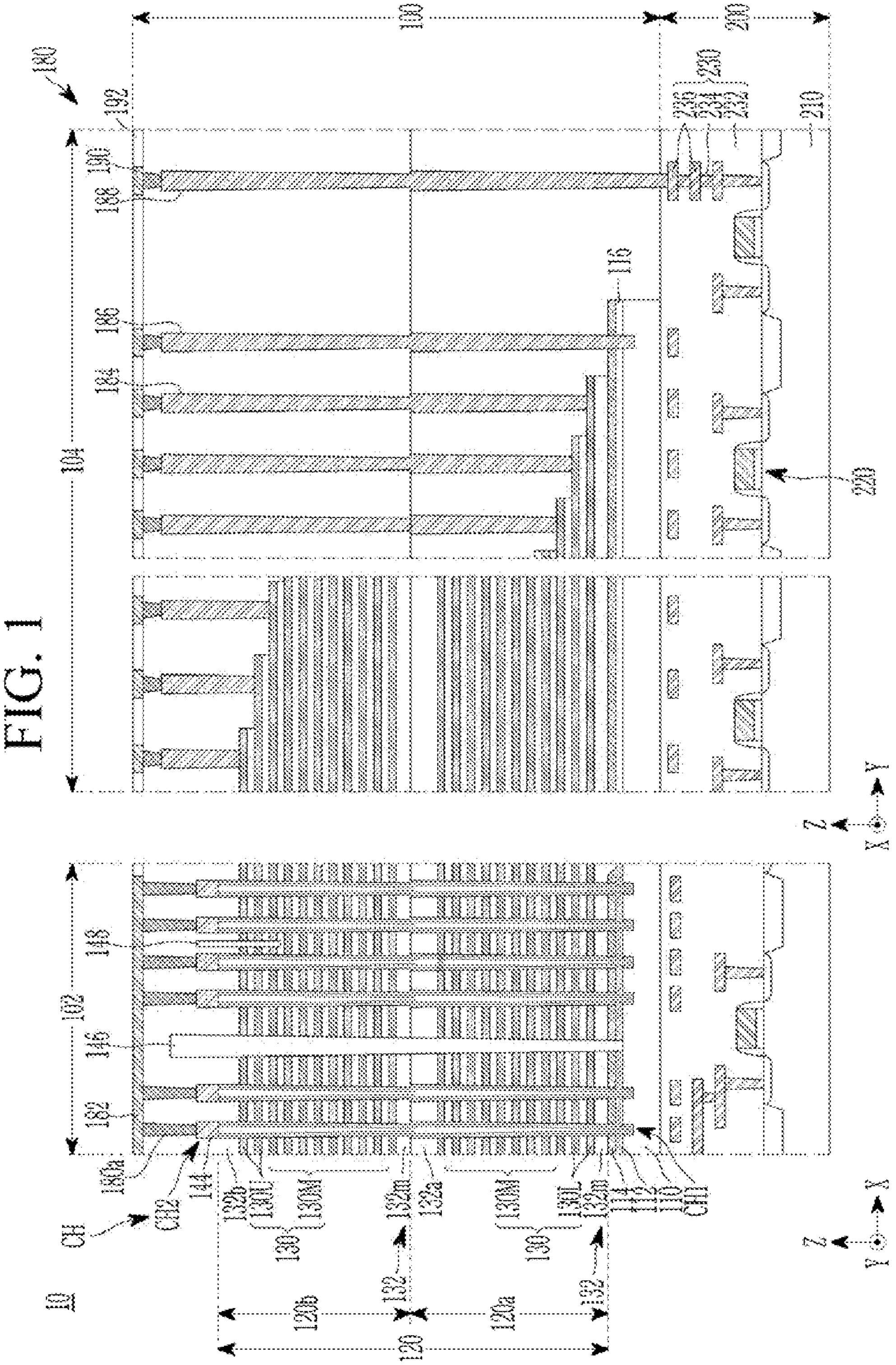
FIG. 1 illustrates a partial cross-sectional view schematically showing a semiconductor device according to an embodiment.
Figure 2A:
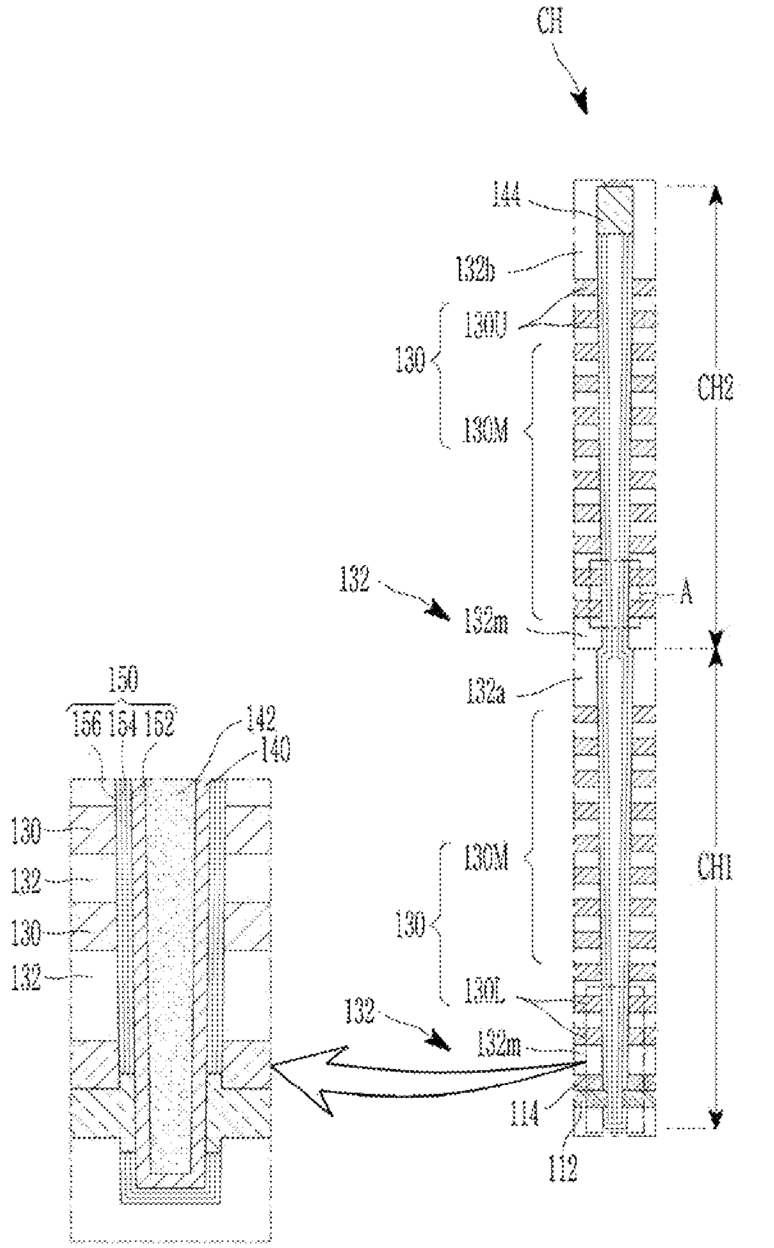
FIG. 2A and FIG. 2B illustrate partial cross-sectional views showing various examples of a channel structure included in the semiconductor device illustrated in FIG. 1.
Figure 2B:
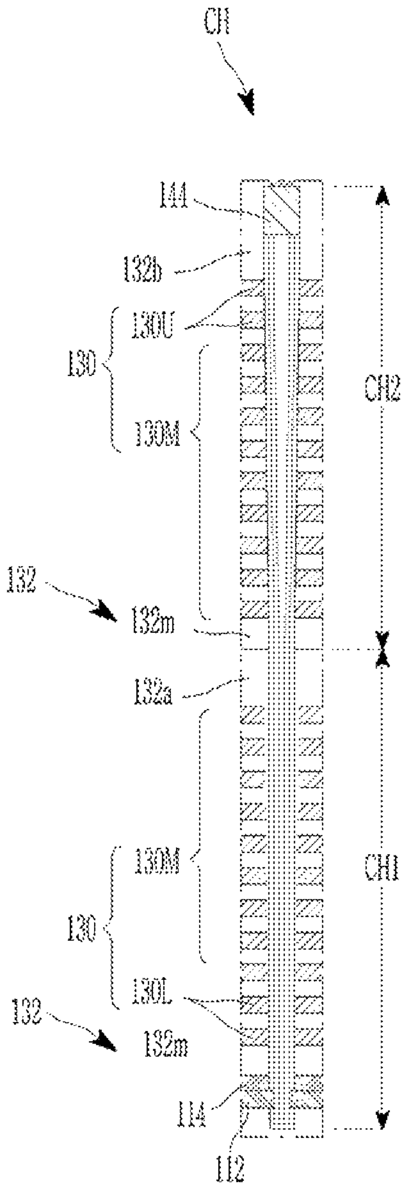

FIG. 1 illustrates a partial cross-sectional view showing a semiconductor device according to an embodiment, and FIG. 2A and FIG. 2B illustrate partial cross-sectional views showing various examples of a channel structure included in the semiconductor device illustrated in FIG. 1.

Referring to FIG. 1 and FIG. 2A, a semiconductor device 10 according to an embodiment includes a cell region 100 including a memory cell structure and a circuit region 200 including a peripheral circuit structure for controlling an operation of the memory cell structure. In an implementation, the circuit region 200 and the cell region 100 may respectively be portions corresponding to a first structure 1100F and a second structure 1100S of a semiconductor device 1100 included in an electronic system 1000 illustrated in FIG. 16. In an implementation, the circuit region 200 and the cell region 100 may be portions including a first structure 3100 and a second structure 3200 of a semiconductor chip 2200 illustrated in FIG. 18, respectively.

Herein, the circuit region 200 may include a peripheral circuit structure on a first substrate 210, and the cell region 100 may include a gate stack structure 120 and a channel structure CH on a cell array region 102 of the second substrate 110 as a memory cell structure. The circuit region 200 may include a first wire portion 230 electrically connected to the peripheral circuit structure, and the cell region 100 may include a second wire portion 180 electrically connected to the memory cell structure.

In an implementation, the cell region 100 may be on the circuit region 200. In an implementation, an area corresponding to the circuit region 200 may not need to be secured separately from the cell region 100, and an area of the semiconductor device 10 may be reduced. In an implementation, the circuit region 200 may be next to (e.g., laterally adjacent to) the cell region 100. Numerous other variations are possible.

The circuit region 200 may include the first substrate 210, and a circuit element 220 and the first wire portion 230 on the first substrate 210.

The first substrate 210 may be a semiconductor substrate including a semiconductor material. In an implementation, the first substrate 210 may be a semiconductor substrate made of a semiconductor material or may be a semiconductor substrate on which a semiconductor layer is formed on a base substrate. In an implementation, the first substrate 210 may include, e.g., monocrystalline or polycrystalline silicon, epitaxial silicon, germanium, silicon-germanium, silicon on insulator (SOI), or germanium on insulator (GOI). As used herein, the term "or" is not an exclusive term, e.g., "A or B" would include A, B, or A and B.

The circuit element 220 on the first substrate 210 may include any of various circuit elements that control the operation of the memory cell structure in the cell region 100. In an implementation, the circuit element 220 may include peripheral circuit structures such as a decoder circuit (reference numeral 1110 in FIG. 16), a page buffer (reference numeral 1120 in FIG. 16), or a logic circuit (reference numeral 1130 in FIG. 16).

The circuit element 220 may include, e.g., a transistor. In an implementation, the peripheral circuit element 220 may include not only active elements such as transistors, but also passive elements such as capacitors, resistors, or inductors.

The first wire portion 230 on the first substrate 210 may be electrically connected to the circuit element 220. In an implementation, the first wire portion may include a plurality of wiring layers 236 spaced apart with a first insulating layer 232 therebetween and connected to form a desired path by a contact via 234. The wiring layer 236 or the contact via 234 may include any of various conductive materials, and the first insulating layer 232 may include any of various insulating materials.

The cell region 100 may include the cell array region 102 and a connecting region 104. The gate stack structure 120 and the channel structure CH may be on the second substrate 110 in the cell array region 102. In the connecting region 104, a structure for connecting the gate stack structure 120 or the channel structure CH in the cell array region 102 to the circuit region 200 or an external circuit may be positioned.

In an implementation, the second substrate 110 may be a semiconductor substrate including a semiconductor material. In an implementation, the second substrate 110 may be a semiconductor substrate made of a semiconductor material or may be a semiconductor substrate on which a semiconductor layer is on a base substrate. In an implementation, the second substrate 110 may include silicon, germanium, silicon-germanium, silicon on insulator, or germanium on insulator. Herein, the semiconductor material included in the second substrate 110 may be doped with a P-type or N-type impurity, and for example, an n-type impurity (e.g., phosphorus (P), arsenic (As), or the like) may be doped.

In the cell array region 102, the gate stack structure 120 including cell insulating layers 132 and gate electrodes 130 alternately stacked on the first surface (e.g., a front surface or an upper surface) of the second substrate 110, and the channel structure CH extending in a direction crossing the second substrate 110 through the gate stack structure 120 may be formed.

In an implementation, horizontal conductive layers 112 and 114 may be between the second substrate 110 and the gate stack structure 120 in the cell array region 102. The horizontal conductive layers 112 and 114 may serve to electrically connect the channel structure CH and the second substrate 110. In an implementation, the horizontal conductive layers 112 and 114 may include a first horizontal conductive layer 112 on the first surface of the second substrate 110, and may further include a second horizontal conductive layer 114 on the first horizontal conductive layer 112. The first horizontal conductive layer 112 may not be provided and a horizontal insulating layer 116 may be between the second substrate 110 and the gate stack structure 120 in a portion of the connecting region 104. In a manufacturing process, a portion of the horizontal insulating layer 116 may be replaced with the first horizontal conductive layer 112, and another portion of the horizontal insulating layer 116 located in the connecting region 104 may remain in the connecting region 104.

The first horizontal conductive layer 112 may function as a portion of a common source line of the semiconductor device 10. In an implementation, the first horizontal conductive layer 112 and the second substrate 110 may function as the common source line. As illustrated in the enlarged view of FIG. 2A, the channel structure CH may extend to the second substrate 110 through the horizontal conductive layers 112 and 114, and the gate dielectric layer 150 may be removed from a portion where the first horizontal conductive layer 112 is positioned so that the first horizontal conductive layer 112 may be directly connected to a channel layer 140 around the channel layer 140.

The first and second horizontal conductive layers 112 and 114 may include a semiconductor material (e.g., polycrystalline silicon). In an implementation, the first horizontal conductive layer 112 may be a polycrystalline silicon layer doped with impurities, and the second horizontal conductive layer 114 may be a polycrystalline silicon layer doped with impurities or a layer including impurities diffused from the first horizontal conductive layer 112. In an implementation, the second horizontal conductive layer 114 may be made of an insulating material. In an implementation, the second horizontal conductive layer 114 may not be provided separately.

The gate stack structure 120 in which the cell insulating layers 132 and the gate electrodes 130 may be alternately stacked may be positioned on the second substrate 110 (e.g., on the first and second horizontal conductive layers 112 and 114 on the second substrate 110).

In an implementation, the gate stack structure 120 may include a plurality of gate stack structures 120*a* and 120*b* sequentially stacked on the second substrate 110. A number of stacked gate electrodes 130 may be increased, and a number of memory cells may be increased with a stable structure. In an implementation, the gate stack structure 120 may include the first and second gate stack structures 120*a* and 120*b*, thereby increasing data storage capacity and simplifying the structure. In an implementation, the gate stack structure 120 may include one gate stack structure or three or more gate stack structures.

In the gate stack structure 120, the gate electrode 130 may include a lower gate electrode 130L, a memory cell gate electrode 130M, and an upper gate electrode 130U sequentially on the second substrate 110. The lower gate electrode 130L may be a gate electrode of a ground select transistor, the memory cell gate electrode 130M may constitute a memory cell, and the upper gate electrode 130U may be a gate electrode of a string select transistor. A number of memory cell gate electrodes 130M may be determined according to data storage capacity of the semiconductor device 10. In an implementation, one or two or more lower gate electrodes 130L and upper gate electrodes 130U may be provided, and it may have a same structure as that of the memory cell gate electrode 130M or a different structure. A portion of the gate electrode 130, e.g., the memory cell gate electrode 130M adjacent to the lower gate electrode 130L and the upper gate electrode 130U, may be a dummy gate electrode.

The cell insulating layers 132 may include an interlayer insulating layer 132*m* below the gate electrode 130 or between two adjacent gate electrodes 130 in first and second gate stack structures 120*a* and 120*b*, and upper insulating layers 132*a* and 132*b* at upper portions of the first and second gate stack structures 120*a* and 120*b*. In an implementation, the upper insulating layers 132*a* and 132*b* may include a first upper insulating layer 132*a* at an upper portion of the first gate stack structure 120*a*, and a second upper insulating layer 132*b* at upper portion of the second gate stack structure 120*b*. In an implementation, the first upper insulating layer 132*a* may be an intermediate insulating layer between the first gate stack structure 120*a* and the second gate stack structure 120*b*, and the second upper insulating layer 132*b* may be an uppermost insulating layer at an uppermost portion of the gate stack structure 120. The second upper insulating layer 132*b* may form part or all of a cell region insulating layer positioned at an entire upper portion of the cell region 100. In an implementation, thicknesses of the cell insulating layers 132 may not all be the same. In an implementation, the thicknesses of the upper insulating layers 132*a* and 132*b* may be greater than the thickness of the interlayer insulating layer 132*m*.

For simplicity of illustration, the cell insulating layer 132 in the connecting region 104 has a boundary between the first stack structure 120*a* and the second stack structure 120*b*. In an implementation, in the connecting region 104, a plurality of insulating layers may have any of various stack structures.

The gate electrode 130 may include any of various conductive materials. In an implementation, the gate electrode 130 may include a metal material such as tungsten (W), copper (Cu), or aluminum (Al). In an implementation, the gate electrode 130 may include polycrystalline silicon, a metal nitride (e.g., titanium nitride (TiN), tantalum nitride (TaN), or the like), or a combination thereof. In an implementation, outside the gate electrode 130, an insulating film made of an insulating material may be positioned, or a portion of the gate dielectric layer 150 may be positioned. The cell insulating layer 132 may include any of various insulating materials. In an implementation, the cell insulating layer 132 may include a silicon oxide, a silicon nitride, a silicon oxynitride, a low dielectric constant material having a lower dielectric constant than the silicon oxide, or a combination thereof.

In an implementation, the channel structure CH extending in a direction crossing the second substrate 110 (e.g., a vertical direction perpendicular to the second substrate 110 or Z-axis direction in the drawing) may extend through the gate stack structure 120.

In an implementation, the channel structure CH may include a channel layer 140 and a gate dielectric layer 150 on the channel layer 140 between the gate electrode 130 and the channel layer 140. The channel structure CH may further include a core insulating layer 142 inside the channel layer 140, and a channel pad 144 on the channel layer 140 or the gate dielectric layer 150.

Each channel structure CH may form one memory cell string, and a plurality of channel structures CH may be spaced apart from each other while forming rows and columns in a plan view. In an implementation, the channel structures CH may be arranged in any of various forms such as a lattice form or a zigzag form in a plan view. The channel structures CH may each have a columnar shape. In an implementation, when the channel structure CH is viewed in a cross-sectional view, it may have an inclined side surface such that its width narrows as it approaches the second substrate 110 according to an aspect ratio.

The core insulating layer 142 may be in a central region of the channel structure CH, and the channel layer 140 may surround sidewalls of the core insulating layer 142. In an implementation, the core insulating layer 142 may have a columnar shape (e.g., a cylindrical shape or a polygonal columnar shape), and the channel layer 140 may have a planar shape such as an annular shape. In an implementation, the core insulating layer 142 may not be provided and the channel layer 140 may have a columnar shape (e.g., a cylindrical shape or a polygonal columnar shape).

The channel layer 140 may include a semiconductor material, e.g., polycrystalline silicon. The core insulating layer 142 may include any of various insulating materials. In an implementation, the core insulating layer 142 may include a silicon oxide, a silicon nitride, a silicon oxynitride, or a combination thereof.

The gate dielectric layer 150 between the gate electrode 130 and the channel layer 140 may include a tunneling layer 152, a charge storage layer 154, and a blocking layer 156 sequentially on (e.g., stacked or layered outwardly from) the channel layer 140.

In an implementation, the tunneling layer 152 may be a layer through which charges are tunneled according to a voltage applied to the gate electrode 130, and may include an insulating material capable of tunneling charges. In an implementation, the tunneling layer 152 may include a carbon-containing layer (reference numeral 152*f* in FIG. 3), which will be described in greater detail below with reference to FIG. 3 and FIG. 4.

The charge storage layer 154 between the tunneling layer 152 and the blocking layer 156 may be a data storage region. In an implementation, the charge storage layer 154 may include a silicon nitride capable of trapping charges, and may be formed of, e.g., a silicon nitride layer. When the charge storage layer 154 is made of a silicon nitride, retention may be excellent and it may be advantageous for integration, compared to being made of polycrystalline silicon.

The blocking layer 156 may be between the charge storage layer 154 and the gate electrode 130. The blocking layer 156 may include an insulating material capable of preventing an undesirable flow of charges into the gate electrode 130. In an implementation, the blocking layer 156 may include a silicon oxide, a silicon nitride, a silicon oxynitride, a high dielectric constant material, or a combination thereof.

Herein, the high dielectric constant material indicates a dielectric material having a higher dielectric constant than that of the silicon oxide. The high dielectric constant material may include, e.g., an aluminum oxide ($Al_2O_3$), a tantalum oxide ($Ta_2O_3$), a titanium oxide ($TiO_2$), a yttrium oxide ($Y_2O_3$), a zirconium oxide ($ZrO_2$), a zirconium silicon oxide ($ZrSi_xO_y$), a hafnium oxide ($HfO_2$), a hafnium silicon oxide ($HfSi_xO_y$), a lanthanum oxide ($La_2O_3$), a lanthanum aluminum oxide ($LaAl_xO_y$), a lanthanum hafnium oxide ($LaHf_xO_y$), a hafnium aluminum oxide ($HfAl_xO_y$), a praseodymium oxide ($Pr_2O_3$), or a combination thereof.

A channel pad 144 may be on the channel layer 140 or the gate dielectric layer 150. The channel pad 144 may cover an upper surface of the core insulating layer 142 and may be electrically connected to the channel layer 140. The channel pad 144 may include a conductive material, e.g., polycrystalline silicon doped with impurities.

As described above, when the gate stack structure 120 includes a plurality of gate stack structures 120*a* and 120*b* stacked on each other, the channel structure CH may include a plurality of channel structures CH1 and CH2 extending through the gate stack structures 120*a* and 120*b*, respectively. In an implementation, when the gate stack structures 120 include the first and second gate stack structures 120*a* and 120*b*, the channel structures CH may include first and second channel structures CH1 and CH2 extending through them, respectively.

The first channel structure CH1 and the second channel structure CH2 may be connected to each other. Each of the first channel structure CH1 and the second channel structure CH2 may have an inclined side surface such that its width becomes narrower closer to the second substrate 110 according to an aspect ratio when viewed in a cross-sectional view. In an implementation, as illustrated in FIG. 2A, a bent or stepped portion may be present due to a difference in width at a portion where the first channel structure CH1 and the second channel structure CH2 are connected. In an implementation, as illustrated in FIG. 2B, the first channel structure CH1 and the second channel structure CH2 may have inclined side surfaces continuously connected without a bent portion (e.g., may have linear side surfaces).

In FIG. 1, an integral structure formed by extending the gate dielectric layer 150, the channel layer 140, and the core insulating layer 142 of the first channel structure CH1 and the second channel structure CH2 is illustrated. After forming a first through portion for the first channel structure CH1 and a second through portion for the second channel structure CH2, the above-described structure may be formed by forming the gate dielectric layer 150, the channel layer 140, and the core insulating layer 142 over the first and second through portions. In an implementation, the gate dielectric layer 150, the channel layer 140, and the core insulating layer 142 of the first channel structure CH1 and the second channel structure CH2 may be separately formed to be electrically connected to each other. In an implementation, after forming the first through portion for the first channel structure CH1, the gate dielectric layer 150, the channel layer 140, and the core insulating layer 142 may be formed in the first through portion, and after forming the second through portion for the second channel structure CH2, the gate dielectric layer 150, the channel layer 140, and the core insulating layer 142 may be formed in the second through portion.

In an implementation, the channel pad 144 may be on the gate stack structure 120 at an upper portion among the plurality of gate stack structures 120 (e.g., a channel structure CH such as a second channel structure CH2) in the second gate stack structure 120*b*). In an implementation, the channel pad 144 may be on each of the first channel structure CH1 and the second channel structure CH2. In this case, the channel pad 144 of the first channel structure CH1 may be connected to the channel layer 140 of the second channel structure CH2.

In an implementation, the gate stack structure 120 may extend in a direction crossing the second substrate 110 (e.g., a vertical direction, i.e., a Z-axis direction in the drawing) to be partitioned in plural in a plan view by a separating structure 146 extending the gate stack structure 120.

In an implementation, the separating structure 146 may extend to the second substrate 110 through the gate electrode 130 and the cell insulating layer 132. In a plan view, the separating structure 146 may extend in one direction (Y-axis direction in the drawing), and may be provided in plural so as to be spaced apart from each other at a predetermined interval in a crossing direction (X-axis direction in the drawing) crossing the one direction. In an implementation, in a plan view, the gate stack structures 120 may each extend in one direction (Y-axis direction in the drawing) and may be spaced apart from each other at a predetermined interval in the crossing direction (X-axis direction in the drawing). The gate stack structures 120 partitioned by the separating structure 146 may constitute one memory cell block.

In an implementation, the separating structure 146 may have an inclined side surface of which width decreases toward the second substrate 110 when viewed in a cross-sectional view due to a high aspect ratio. In an implementation, a side surface of the separating structure 146 may be perpendicular to the second substrate 110. In an implementation, as illustrated in FIG. 1, when viewed in a cross-sectional view, the separating structure 146 may have continuously inclined side surfaces in the first gate stack structure 120*a* and the second gate stack structure 120*b* and does not include a bent portion. In an implementation, the separating structure 146 may have a bent portion at a boundary between the first gate stack structure 120*a* and the second gate stack structure 120*b*.

The separating structure 146 may be filled with a variety of insulating materials. In an implementation, the separating structure 146 may include an insulating material such as a silicon oxide, a silicon nitride, or a silicon oxynitride.

An upper separating region 148 may be at an upper portion of the gate stack structure 120. In a plan view, the upper separating region 148 may extend in one direction (Y-axis direction in the drawing), and may be provided in plural so as to be spaced apart from each other at a predetermined interval in a crossing direction (X-axis direction in the drawing) crossing the one direction.

The upper separating region 148 may be formed by extending through one or a plurality of gate electrodes 130 including the upper gate electrode 130U positioned between the separating structures 146. The upper separating region 148 may separate, e.g., three gate electrodes 130 from each other in the crossing direction (X-axis direction in the drawing). In an implementation, a number of gate electrodes 130 separated by the upper separating region 148 may vary. The upper separating region 148 may have a form filled with an insulating material. In an implementation, the upper separating region 148 may include an insulating material such as a silicon oxide, a silicon nitride, or a silicon oxynitride.

The connecting region 104 and the second wire portion 180 may connect the gate stack structure 120 and the channel structure CH in the cell array region 102 to the circuit region 200 or an external circuit.

Herein, the second wire portion 180 may include all members electrically connecting the gate electrode 130, the channel structure CH, the horizontal conductive layers 112 and 114, or the second substrate 110 to the circuit region 200 or an external circuit. In an implementation, the second wire portion 180 may include a bitline 182, a gate contact portion 184, a source contact portion 186, a through plug 188, and contact vias 180*a* respectively connected to them, and a connecting wire 190 connecting them.

The bitline 182 may be on the cell insulating layer 132 of the gate stack structure 120 formed in the cell array region 102. The bitline 182 may extend (e.g., lengthwise) in the cross direction (X-axis direction in the drawing) crossing one direction in which the gate electrode 130 extends. The bitline 182 may be electrically connected to the channel structure CH, e.g., the channel pad 144, through the contact via 180*a*, e.g., a bit line contact via.

The connecting region 104 may be positioned around the cell array region 102 and a portion of the second wire portion 180 may be positioned. The connecting region 104 may include members for connection with the gate electrode 130, the horizontal conductive layers 112 and 114, or the second substrate 110, and the circuit region 200. In an implementation, the connecting region 104 may include a portion where an input and output pad and an input and output connecting wire are formed.

In an implementation, the gate electrodes 130 may be extended and positioned in one direction (Y-axis direction in the drawing) in the connecting region 104, and extended lengths of the gate electrodes 130 in the connecting region 104 may sequentially decrease as a distance from the second substrate 110 increases. In an implementation, the gate electrodes 130 may be positioned while having a stepped shape in the connecting region 104. In an implementation, the gate electrodes 130 may have a stepped shape in one direction or in a plurality of directions. In the connecting region 104, a plurality of gate contact portions 184 may be electrically connected to the respective gate electrodes 130 extending to the connecting region 104 through the cell insulating layer 132.

In the connecting region 104, the source contact portion 186 may extend through the cell insulating layer 132 to be electrically connected to the horizontal conductive layers 112 and 114 or the second substrate 110, and the through plug 188 may extend through the gate stack structure 120 or may be positioned outside the gate stack structure 120 to be electrically connected to the first wire portion 230 of the circuit region 200.

The connecting wire 190 may be in the cell array region 102 or the connecting region 104. The bitline 182, the gate contact portion 184, the source contact portion 186, and/or the through plug 188 may be electrically connected to the connecting wire 190. In an implementation, the gate contact portion 184, the source contact portion 186, or the through plug 188 may be connected to the connecting wire 190 through the contact via 180*a*.

In an implementation, as illustrated in FIG. 1, the connecting wire 190 may be a single layer on a same plane as the bitline 182, and the second insulating layer 192 may be in a portion other than the second wire portion 180. In an implementation, the connecting wire 190 may include a plurality of wiring layers for electrical connection with the bitline 182, the gate contact portion 184, the source contact portion 186, or the through plug 188, and may further include contact vias.

As described above, the bitline 182, the gate electrode 130, the horizontal conductive layers 112 and 114, or the second substrate 110 connected to the channel structure CH may be electrically connected to the circuit element 220 of the circuit region 200 by the second wire portion 180 and the first wire portion 230.

In an implementation, as illustrated in FIG. 1, when viewed in a cross-sectional view, the gate contact portion 184, the source contact portion 186, or the through plug 188 may have inclined side surfaces such that widths thereof become narrower as they are closer to the second substrate 110 according to an aspect ratio, and a bent portion may be at a boundary between the first gate stack structure 120*a* and the second gate stack structure 120*b*. In an implementation, the gate contact portion 184, the source contact portion 186, or the through plug 188 may not have a bent portion at the boundary between the first gate stack structure 120*a* and the second gate stack structure 120*b*.

In an implementation, the gate dielectric layer 150 may include the tunneling layer 152, the charge storage layer 154, and the blocking layer 156 sequentially on the channel layer 140 and between the channel layer 140 and the gate electrode 130. In an implementation, the tunneling layer 152 may include a carbon-containing layer (reference numeral 152*f* in FIG. 3) closer to the channel layer 140 than to the charge storage layer 154. This will be described in more detail with reference to FIG. 3 and FIG. 4.

Figure 3:
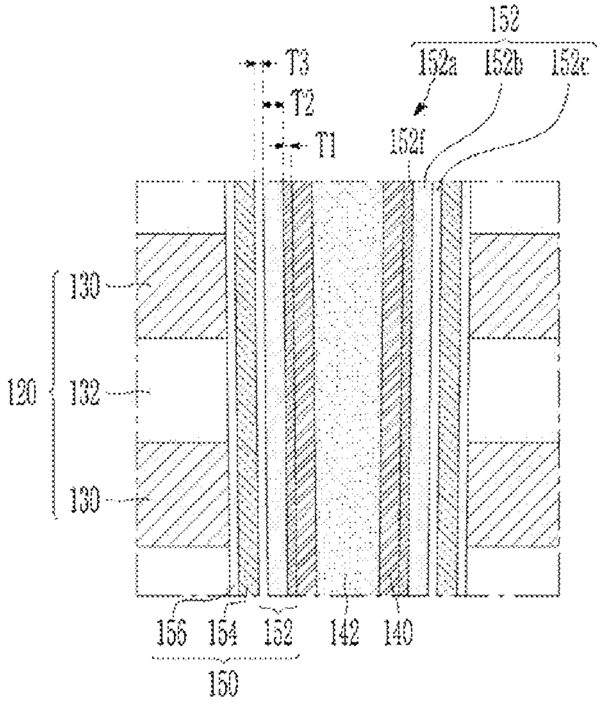
FIG. 3 illustrates an enlarged partial cross-sectional view of a portion A of FIG. 2A.

FIG. 3 illustrates an enlarged partial cross-sectional view of a portion A of FIG. 2A.

Referring to FIG. 3, in an embodiment, the tunneling layer 152 may include a first tunneling layer 152*a* on the channel layer 140 and a second tunneling layer 152*b* on the first tunneling layer 152*a*. The second tunneling layer 152*b* may be made of a different material from that of the first tunneling layer 152*a*, and may have a greater thickness than that of the first tunneling layer 152*a*. In an implementation, a third tunneling layer 152*c* having a different material or a different composition from that of the second tunneling layer 152*b* may be further included between the second tunneling layer 152*b* and the charge storage layer 154. In an implementation, the carbon-containing layer 152*f* may constitute part or all of the first tunneling layer 152*a*.

The first tunneling layer 152*a* adjacent to the channel layer 140 or the third tunneling layer 152*c* adjacent to the charge storage layer 154 may have a material or composition having a smaller dielectric constant and greater bandgap energy than those of the second tunneling layer 152*b*.

The first tunneling layer 152*a* or the third tunneling layer 152*c* may have a relatively small dielectric constant and a relatively large bandgap energy, to help prevent the charge stored in the charge storage layer 154 from undesirably escaping when no voltage is applied to the gate electrode 130 (e.g., when maintaining data). In an implementation, storage stability may be improved by the first tunneling layer 152*a* or the third tunneling layer 152*c*.

The second tunneling layer 152*b* having a relatively large dielectric constant and relatively small bandgap energy compared to the first tunneling layer 152*a* and the third tunneling layer 152*c* may have excellent insulating characteristics. Accordingly, even if a total thickness of the tunneling layer 152 including the second tunneling layer 152*b* were to be reduced, excellent insulating characteristics may be maintained, thereby reducing the thickness of the tunneling layer 152. Then, an operating speed may be improved by reducing an operating voltage, and distribution of a threshold voltage may be improved by reducing a leakage current.

In an implementation, the tunneling layer 152 may include the first tunneling layer 152*a*, the second tunneling layer 152*b*, and the third tunneling layer 152*c* having different materials or compositions, so as to help reduce the operating voltage, to help improve the operating speed, and to help reduce the leakage current while improving the storage stability. In an implementation, the tunneling layer 152 may have a structure capable of effectively improving various characteristics.

In an implementation, the first tunneling layer 152*a* may include the carbon-containing layer 152*f* made of a silicon oxide material including silicon and oxygen and including carbon. In an implementation, the carbon-containing layer 152*f* may include a silicon oxycarbide (SiOC) including silicon, oxygen, and carbon. In an implementation, the carbon-containing layer 152*f* may be a hydrogenated silicon oxycarbide layer including hydrogenated silicon oxycarbide (SiOC:H) in which hydrogen is bonded to silicon or silicon oxycarbide. When hydrogen is bonded, defects may be reduced. For reference, the chemical formula SiOC:H for the above-described hydrogenated silicon oxycarbide is based on elements included in the hydrogenated silicon oxycarbide, and does not indicate a specific chemical quantitative ratio.

The carbon-containing layer 152*f* may have a lower dielectric constant than that of a silicon oxide by including carbon in a silicon oxide-based material. As such, the carbon-containing layer 152*f* having a low dielectric constant (low-k) may react sensitively to an electric field when a voltage is applied. Accordingly, the carbon-containing layer 152*f* may be an electric field concentration layer in which an electric field is concentrated. As such, when the electric field is concentrated on the carbon-containing layer 152*f*, a magnitude of a gradient of an energy level in an FN tunneling region (reference numeral FN1 in FIG. 4, hereinafter the same) where the Fowler-Nordheim (FN) tunneling occurs may be increased. As a result, the FN tunneling area FN1 may be widened, and thus a tunneling distance of charges may be reduced. In addition, the silicon oxycarbide may have smaller bandgap energy than that of the silicon oxide, and the bandgap energy may decrease as a content of carbon in the silicon oxycarbide increases. Accordingly, the carbon-containing layer 152*f* may have a small bandgap energy, so that charge tunneling can be easily performed.

As such, an energy band diagram may be adjusted as desired such that charge tunneling may easily occur through the carbon-containing layer 152*f*. As a result, an operation speed and durability of the semiconductor device 10 may be improved.

Moreover, within a certain range, as the carbon content increases, a breakdown voltage (BV) and a breakdown time (Tbd) of the carbon-containing layer 152*f* may increase, thereby reducing a leakage current.

In an implementation, the carbon-containing layer 152*f* including hydrogenated silicon oxycarbide may include, e.g., 0.2 at % to 10 at % of carbon. If carbon were to be included in an amount of less than 0.2 at %, an effect of carbon may not be sufficient. If carbon were to be included in an amount exceeding 10 at %, the carbon may be agglomerated to form a current path, whereby an effect of increasing the breakdown voltage by the carbon may be rather reduced.

Whether carbon is included in the carbon-containing layer 152*f*, the content of carbon, and the like may be determined by any of various composition detection methods. In an implementation, they may be determined by energy dispersive X-ray spectroscopy (EDS), electron energy loss spectroscopy (EELS), or the like.

In an implementation, a thickness T1 of the first tunneling layer 152*a* may be smaller than a thickness T2 of the second tunneling layer 152*b*, e.g., 5 nm or less (e.g., 0.1 nm to 5 nm). If the thickness T1 of the first tunneling layer 152*a* were to exceed 5 nm, the operation speed could be lowered or a relatively high operation voltage could be required, which may not be advantageous in terms of durability. If the thickness T1 of the first tunneling layer 152*a* were to be less than 0.1 nm, storage stability could be deteriorated. Accordingly, the thickness of the carbon-containing layer 152*f* constituting part or all of the first tunneling layer 152*a* may be smaller than the thickness T2 of the second tunneling layer 152*b*, and may have a thickness of, e.g., 5 nm or less (more specifically, 0.1 nm to 5 nm). In an implementation, the thickness of the carbon-containing layer 152*f* may be 2 nm or less to effectively implement an effect of the carbon-containing layer 152*f*.

In an implementation, the carbon-containing layer 152*f* may be made of a silicon oxide material, and thus storage stability may be excellently maintained, and it may have a lower dielectric constant than that of a silicon oxide by including carbon, thereby improving an operation speed, durability, and reliability.

In an implementation, the first tunneling layer 152*a* may have a single-layered structure including the carbon-containing layer 152*f*. In an implementation, the carbon-containing layer 152*f* may be in contact (e.g., direct contact) with the channel layer 140 and the second tunneling layer 152*b*. Accordingly, a structure of the first tunneling layer 152*a* may be simplified, and an effect of the carbon-containing layer **152*f* may be maximized. Various embodiments of the first tunneling layer 152*a* including the carbon-containing layer 152*f* will be described below in more detail with reference to FIG. 7 to FIG. 9**.

The second tunneling layer **152*b* on the first tunneling layer 152*a* may include a silicon oxynitride (SiON) including silicon, oxygen, and nitrogen. The silicon oxynitride may have excellent insulating characteristics and has a lower trap density than that of the silicon oxide, which may help reduce a leakage current due to traps during data retention. In an implementation, the second tunneling layer 152*b*** may include a hydrogenated silicon oxynitride (SiON:H) in which hydrogen is bonded to the silicon oxynitride. For reference, the chemical formula SiON:H for the above-described hydrogenated silicon oxynitride is based on elements included in the hydrogenated silicon oxynitride, and does not indicate a specific chemical quantitative ratio.

The thickness T2 of the second tunneling layer **152*b* may be greater than each of the thickness T1 of the first tunneling layer 152*a* and the thickness T3 of the third tunneling layer 152*c*. In an implementation, the thickness T2 of the second tunneling layer 152*b* may be 10 nm or less (e.g., 1 nm to 10 nm). If the thickness of the second tunneling layer 152*b* were to exceed 10 nm, the thickness of the tunneling layer 152 could increase, so that it could be difficult to sufficiently realize an effect of reducing the operation voltage and improving the operating speed. If the thickness of the second tunneling layer 152*b* were to be too thin (e.g., less than 1 nm), it could be difficult for the tunneling layer 152** to have excellent insulating characteristics.

The third tunneling layer **152*c* may include a silicon oxynitride including silicon, oxygen, and nitrogen as basic materials, and may have a different composition from that of the second tunneling layer 152*b*. In an implementation, the third tunneling layer 152*c* may have a lower nitrogen content than that of the second tunneling layer 152*b*. In an implementation, the third tunneling layer 152*c* may include a hydrogenated silicon oxynitride in which hydrogen is bonded to the silicon oxynitride including silicon, oxygen, and nitrogen. In an implementation, a material of the third tunneling layer 152*c* may be different from that of the second tunneling layer 152*b*. In an implementation, the third tunneling layer 152*c* may be made of a silicon oxide. In an implementation, the third tunneling layer 152*c*** may not be separately provided (e.g., may be omitted).

The thickness T3 of the third tunneling layer **152*c* may be smaller than the thickness T2 of the second tunneling layer 152*b*, may be equal to the thickness T1 of the first tunneling layer 152*a*, or may be smaller or greater than the thickness T1 of the first tunneling layer 152*a*. In an implementation, the thickness T3 of the third tunneling layer 152*c* may be 5 nm or less (e.g., 0.1 nm to 5 nm). This is a range considering the effect of the third tunneling layer 152*c***.

As described above, in an embodiment, the first tunneling layer **152*a* between the channel layer 140 and the second tunneling layer 152*b* (having a largest thickness T2 in the tunneling layer 152) may include the carbon-containing layer 152*f*, and the carbon-containing layer 152*f* may be closer to the channel layer 140 than it is to the charge storage layer 154. In an implementation, a distance between the carbon-containing layer 152*f* and the channel layer 140 may be smaller than a distance between the carbon-containing layer 152*f* and the charge storage layer 154. In the tunneling layer 152, the first tunneling layer 152*a* may be adjacent to the channel layer 140 to have a great influence on charge tunneling, and the first tunneling layer 152*a* may include the carbon-containing layer 152*f*** so that charge tunneling can easily occur.

Figure 4A:
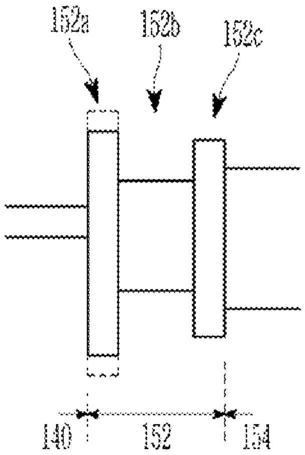
FIG. 4A and FIG. 4B illustrates an energy band diagram showing examples of energy levels of a semiconductor device according to an embodiment.
Figure 4B:
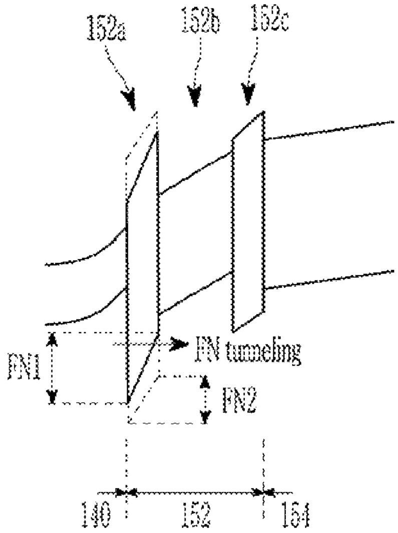

A reason why tunneling of charges can occur more easily when the first tunneling layer **152*a* includes the carbon-containing layer 152*f* as described above will be described in more detail below with reference to FIGS. 4A and 4B together with FIG. 3. FIGS. 4A and 4B illustrate an energy band diagram showing examples of energy levels of a semiconductor device according to an embodiment. FIG. 4A illustrates an energy band diagram in a state in which no voltage is applied to the semiconductor device, and FIG. 4**B illustrates an energy band diagram in a state in which a voltage for an erase operation is applied to the semiconductor device.

In FIGS. 4A and 4B, energy levels of the channel layer 140, the tunneling layer 152, and the charge storage layer 154 are shown as solid lines when the first tunneling layer **152*a* is made of a carbon-containing layer 152*f* made of a silicon oxycarbide layer according to the embodiment. For reference, in the case of a Comparative Embodiment, in which the first tunneling layer is formed of a silicon oxide layer, the energy level of the first tunneling layer is shown as a dotted line. In this case, in FIGS. 4A and 4B, differences of the carbon-containing layer 152*f* or the first tunneling layer 152*a*** are mainly illustrated for clear understanding and simple illustration. For reference, the semiconductor device according to the Comparative Embodiment may have a same structure as the semiconductor device according to the illustrated embodiment, except that the first tunneling layer is made of a silicon oxide layer and does not include a carbon-containing layer.

Referring to FIGS. 4A and 4B, it may be seen that band gap energy of the first tunneling layer **152*a* according to the embodiment may be smaller than band gap energy of the first tunneling layer 152*a* according to the Comparative Embodiment. In the embodiment, the first tunneling layer 152*a* may include a carbon-containing layer and may have smaller bandgap energy than that of the first tunneling layer according to the Comparative Embodiment. As described above, in the embodiment, the first tunneling layer 152*a* has higher bandgap energy than that of the second tunneling layer 152*b*** to maintain storage stability, while reducing the bandgap energy compared to that of the first tunneling layer according to the Comparative Embodiment, so that charge tunneling may easily occur.

Referring to FIG. 4A, it may be seen that an energy level of the first tunneling layer **152*a* according to the embodiment may be more affected by an electric field than that of the first tunneling layer 152*a* according to the Comparative Embodiment. Accordingly, the gradient of the energy level in the FN tunneling region FN1 of the embodiment may be greater than the gradient of the energy level in the FN tunneling region FN2 of the Comparative Embodiment. Accordingly, the FN tunneling region FN1 of the embodiment may be wider than that of the FN tunneling region FN2** of the Comparative Embodiment, and a charge tunneling distance may be reduced even when a same voltage is applied. Accordingly, the operation speed and durability of an erasing operation may be improved. On the other hand, in the Comparative Embodiment, when the same voltage is applied, deformation of the first tunneling layer due to the electric field may not be large, so the operation speed may not be high.

The erasing operation is presented as an example in FIGS. 4A and 4B, and the first tunneling layer **152*a*** may be more deformed by the electric field even during a program operation, so that the operation speed may be improved.

According to the embodiment, the carbon-containing layer **152*f* having a relatively low dielectric constant may include carbon at a portion that is adjacent to the channel layer 140 rather than the charge storage layer 154 in the tunneling layer 152 and functioning as an electric field concentration layer may be provided, thereby facilitating charge tunneling. Accordingly, the operation speed and durability may be improved. In an implementation, the carbon-containing layer 152*f*** may include a silicon oxycarbide, and thus reliability may be improved by increasing a breakdown voltage and reducing a leakage current.

FIG. 3 illustrates that the first tunneling layer **152*a* may be in contact with the channel layer 140, the second tunneling layer 152*b* may be contact with the first tunneling layer 152*a*, and the third tunneling layer 152*c* may be in contact with the second tunneling layer 152*b* and the charge storage layer 154. Accordingly, various characteristics as described above may be effectively improved while simplifying a structure of the tunneling layer 152. In an implementation, a separate layer may be further positioned between two adjacent layers among the channel layer 140, the first tunneling layer 152*a*, the second tunneling layer 152*b*, the third tunneling layer 152*c*, and the charge storage layer 154. Even in this case, the carbon-containing layer 152*f* included in the first tunneling layer 152*a* may be positioned closer to the channel layer 140 than to the charge storage layer 154, and may remain spaced apart from the charge storage layer 154**.

An example of a manufacturing method for manufacturing the semiconductor device 10 having the above structure will be described in detail with reference to FIG. 5A to FIG. 5E. Detailed descriptions of parts that have already been described may be omitted, and parts that have not been described will be described in detail.

FIG. 5A to FIG. 5E each illustrate a partial cross-sectional view of stages in a manufacturing method of a semiconductor device according to an embodiment. In FIG. 5A to FIG. 5E, the portion illustrated in FIG. 3 is mainly illustrated, and the method of manufacturing the semiconductor device is mainly described for the gate stack structure 120 and the channel structure CH formed in the cell region 100.

Figure 5A:
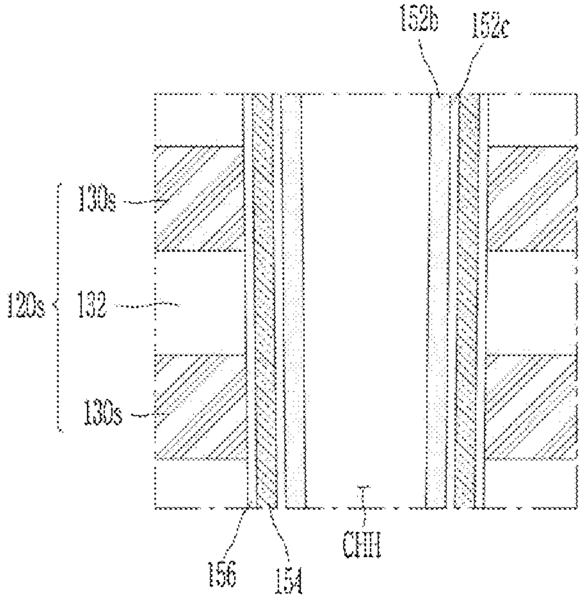
FIG. 5A to FIG. 5E each illustrate a partial cross-sectional view of stages in a manufacturing method of a semiconductor device according to an embodiment.

Referring to FIG. 5A, a horizontal insulating layer (reference numeral 116 of FIG. 1, hereinafter the same) and a second horizontal conductive layer 114 may be formed on the second substrate (reference numeral 110 of FIG. 1), and a stack structure **120*s* may be formed by alternately stacking a sacrificial insulating layer 130*s* and the cell insulating layer 132, and then a through portion CHH extending through the stack structure 120*s* may be formed. In addition, at least a portion of the blocking layer 156, the charge storage layer 154, the third tunneling layer 152*c*, and the second tunneling layer 152*b*** may be sequentially formed in each through portion CHH.

Herein, the sacrificial insulating layer **130*s* may be a layer replaced with a gate electrode (reference numeral 130 of FIG. 1, hereinafter the same) in a subsequent process, and at least a portion of the horizontal insulating layer 116 may be replaced by a first horizontal conductive layer (reference numeral 112 of FIG. 1, hereinafter the same) in a subsequent process. In an implementation, the sacrificial insulating layer 130*s* may correspond to a portion where the gate electrode 130 is to be formed, and the horizontal insulating layer 116 may include a portion where the first horizontal conductive layer 112** is to be formed.

The horizontal insulating layer 116 or the sacrificial insulating layer **130*s* may be formed of a different material from that of the cell insulating layer 132. In an implementation, the cell insulating layer 132 may include a silicon oxide, a silicon nitride, a silicon oxynitride, a low dielectric constant material, or the like, and the sacrificial insulating layer 130*s* may include one of silicon, silicon oxide, silicon carbide, silicon nitride, or the like, and may be made of a different material from that of the cell insulating layer 132**.

The penetrating portion CHH may be formed while extending through the stack structure **120*s* to provide a space in which a channel structure (reference numeral CH in FIG. 1) is to be formed. The through portion CHH may be formed by an etching process, e.g., an anisotropic etching process. In an implementation, the through portion CHH may have any of various shapes extending through the stack structure 120*s*** as a whole corresponding to a shape of the channel structure CH.

In an implementation, the stack structure **120*s* may include a first stack structure and a second stack structure corresponding to the first gate stack structure (reference numeral 120*a* in FIG. 1, hereinafter the same) and the second gate stack structure (reference numeral 120*b* in FIG. 1, hereinafter the same). The through portions CHH may include a first through portion formed through the first stack structure to provide a space in which a first channel structure (reference numeral CH1 in FIG. 1) is to be formed, and a second through portion formed through the second stack structure to provide a space in which a second channel structure (reference numeral CH2 in FIG. 1**) is to be formed.

In an implementation, the first stack structure may be formed and the first through portion may be formed, and then the second stack structure may be formed and the second through portion may be formed. In an implementation, the first stack structure and the second stack structure may be formed, and then the first through portion may be formed through the second through portion after the second through portion is formed. In an implementation, a forming process and a forming order of the stacking structure and the through portion may be modified in various ways.

At least a portion of the blocking layer 156, the charge storage layer 154, the third tunneling layer **152*c*, and the second tunneling layer 152*b* may be sequentially formed in the through portion CHH. At least a portion of the blocking layer 156, the charge storage layer 154, the third tunneling layer 152*c*, and the second tunneling layer 152*b*** may be formed using an atomic layer deposition (ALD) process or a chemical vapor deposition (CVD) process.

In an implementation, an upper separating region (reference numeral 148 in FIG. 1, hereinafter the same) may be on a portion of the stack structure **120*s*. The upper separating region 148** may be formed by forming an upper separating opening by an etching process using a mask layer and depositing an insulating material in the upper separating opening.

Figure 5B:
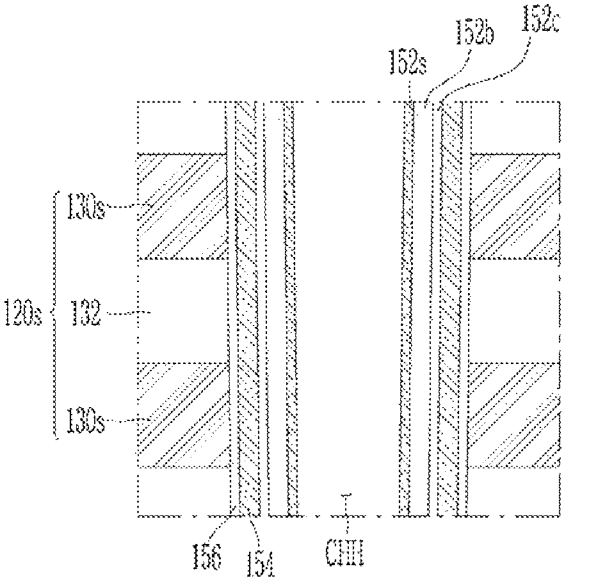
Figure 5C:
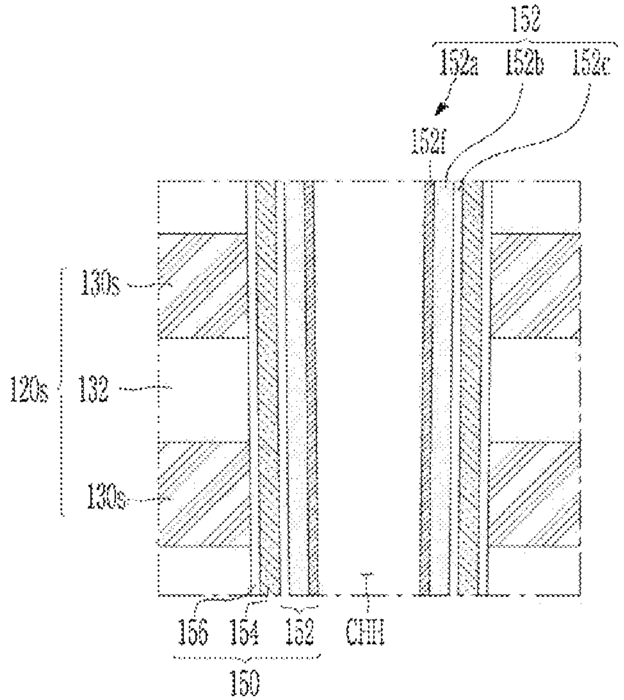

Subsequently, as illustrated in FIG. 5B and FIG. 5C, the first tunneling layer **152*a* may be on the second tunneling layer 152*b*. In an implementation, as illustrated in FIG. 5B, a base tunneling layer 152*s* having a silicon oxide as a base material may be formed, and then as illustrated in FIG. 5C, a first tunneling layer 152*a* including the carbon-containing layer 152*f* may be formed by performing the carbon doping process in which carbon is doped into the base tunneling layer 152*s***.

In an implementation, a carbon doping process of doping carbon into the base tunneling layer **152*s*** may be performed by a plasma assisted doping (PLAD) process.

Figure 6:
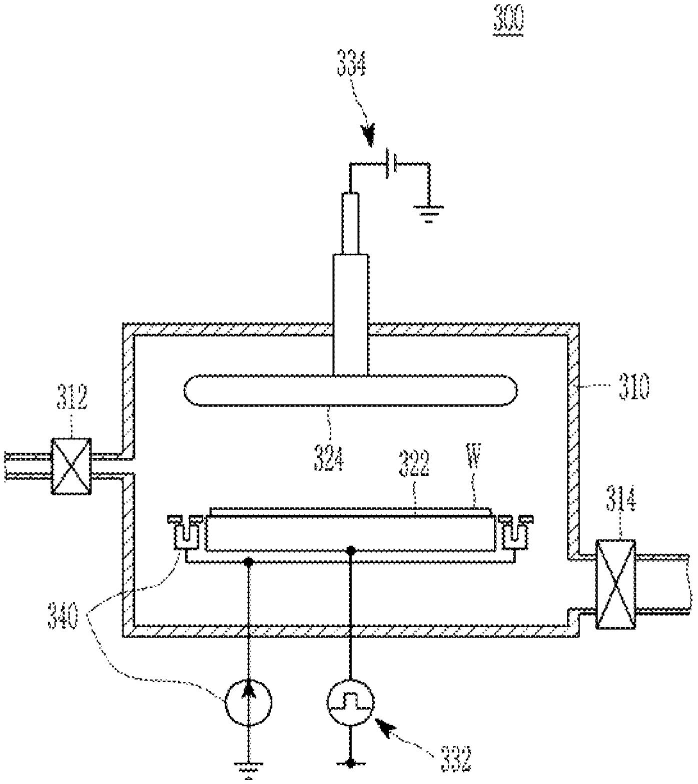
FIG. 6 conceptually illustrates an example of a plasma assisted doping device used in a manufacturing method of a semiconductor device according to an embodiment.

The plasma assisted doping process will be described in more detail below with reference to FIG. 6 together with FIG. 5B and FIG. 5C. FIG. 6 conceptually illustrates an example of a plasma assisted doping device used in a manufacturing method of a semiconductor device according to an embodiment.

Referring to FIG. 5B, FIG. 5C, and FIG. 6, a plasma assisted doping device 300 may include a chamber 310, a first electrode 322, a second electrode 324, power supplies 332 and 334, and a meter 340.

The chamber 310 may provide an internal space for performing the plasma assisted doping process. The chamber 310 may include a gas supply unit 312 for supplying doping gas to the internal space of the chamber 310 and a vacuum unit 314 for vacuuming the internal space of the chamber 310.

The first electrode 322 and the second electrode 324 facing each other may be in the internal space of the chamber 310. The first electrode 322 and the second electrode 324 may function as a lower electrode and an upper electrode that excite the doping gas to a plasma state. In addition, a workpiece W to be doped may be positioned on the first electrode 322, and the first electrode 322 may function as a support for supporting the workpiece W. A bias voltage may be supplied to the first electrode 322 by the first power supply 332, and a ground voltage may be supplied to the second electrode 324 by the second power supply 334. In an implementation, the bias voltage may be provided to the first electrode 322 in the form of a pulse.

The meter 340 for measuring a dose of ions or radicals in plasma may be in the chamber 310. In an implementation, in order to improve accuracy, the meter 340 may be in a periphery of the first electrode 322 where the workpiece W is positioned.

As illustrated in FIG. 5B, a doping gas may be supplied to the internal space of the chamber 310 and a voltage is supplied to the first electrode 322 and the second electrode 324 in a state where the workpiece W including the base tunneling layer 152*s* is positioned on the first electrode 322. Then, the doping gas in the chamber 310 may be excited into a plasma state, and ions or radicals in the plasma may be doped into the base tunneling layer 152*s* with the workpiece W.

In an implementation, in the plasma assisted doping process, the base tunneling layer 152*s* may be doped with carbon including a carbon supply material using the doping gas to form the carbon-containing layer 152*f*. In an implementation, the doping gas may include a carbonized hydrogen (hydrocarbon) gas and a carrier gas (or dilution gas) as a carbon supply material. In an implementation, methane ($CH_4$) gas may be used as the hydrocarbon gas, and argon (Ar) gas or hydrogen ($H_2$) gas may be used as the carrier gas. The carbon supply material may be included at 10 vol % or less with respect to 100 vol % of the total doping gas, and a bias voltage may be 1 kV or less, and RF power may be 3,000 W or less. The dose measured by the meter 340 may be $2\times10^{16}$ pcs/$cm^2$ or less. This is an example of a process condition for the carbon-containing layer 152*f* to include 0.2 at % to 10 at % of carbon.

In an implementation, a doping depth of carbon doped in the carbon-containing layer 152*f* may be related to the bias voltage, and a content of carbon doped in the carbon-containing layer 152*f* may be related to a ratio of the carbon supply gas to the carrier gas and a process time. If the ratio of the carbon supply gas were to be too high, carbon may not be doped and may be deposited on a surface thereof. An amount of carbon doped into the carbon-containing layer 152*f* may be controlled by lowering the ratio of the carbon supply gas to a predetermined ratio or less and adjusting the process time. In an implementation, the process time of the plasma assisted doping process may be adjusted such that the carbon-containing layer 152*f* may include 0.2 at % to 10 at % of carbon.

This plasma assisted doping process may generate a large amount of ions at low energy and may dope carbon to have a desired doping concentration and doping depth may be suitably applied to form the carbon-containing layer 152*f* in the semiconductor device 10.

Figure 5D:
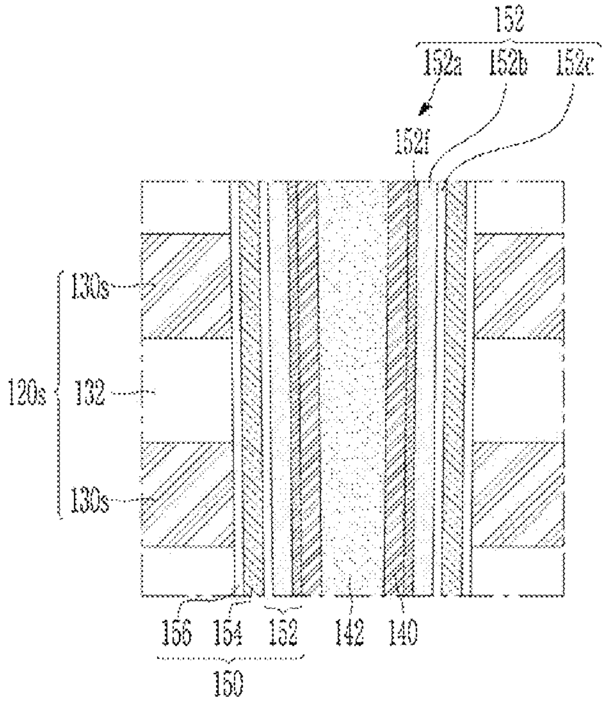

Subsequently, as illustrated in FIG. 5D, in each through portion CHH, the channel layer 140 and the core insulating layer 142 may be disposed on the gate dielectric layer 150, and the channel structure CH may be formed by forming a channel pad (reference numeral 144 in FIG. 1) on the channel layer 140.

In an implementation, the channel layer 140 may be on the gate dielectric layer 150 within the through portion CHH. A material constituting the channel layer 140 may be deposited to a first thickness, and then a crystallization process may be performed, and the channel layer 140 may be formed by partially etching the channel layer 140 to have a second thickness that is smaller than the first thickness. The core insulating layer 142 may be on the channel layer 140 and fill the through portion CHH.

Figure 5E:
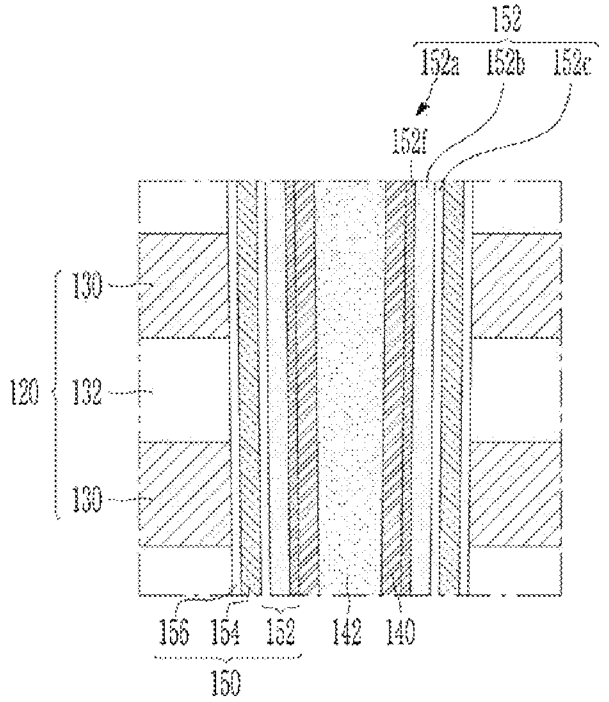

Subsequently, as illustrated in FIG. 5E, the gate stack structure 120 may be formed by removing the sacrificial insulating layer (reference numeral 130*s* in FIG. 5D, hereinafter the same) and forming the gate electrode 130 in a region where the sacrificial insulating layer 130*s* was positioned.

In an implementation, an opening may be formed to extend through a stacking structure in which the sacrificial insulating layer 130*s* and the cell insulating layer 132 are stacked (reference numeral 120*s* in FIG. 5D). This opening may be formed in a region corresponding to the separating structure (reference numeral 146 in FIG. 1, hereinafter the same). The sacrificial insulating layer 130*s* may be selectively removed by an etching process (e.g., a wet etching process) through the opening. In an implementation, the gate electrode 130 may be formed by filling a conductive material constituting the gate electrode 130 in a portion where the sacrificial insulating layer 130*s* is removed. In this case, an opening may be formed to expose the horizontal insulating layer 116. In an etching process through the opening, at least a portion of the horizontal insulating layer 116 may be removed, and a material constituting the first horizontal conductive layer 112 may be buried to form the first horizontal conductive layer 112.

In addition, an insulating material may be filled in the opening to form the separating structure 146. Thereafter, an upper wire structure connected to the channel structure CH may be further formed.

FIG. 5A to FIG. 5E each illustrate a stage in a manufacturing method using the stack structure 120*s* including the sacrificial insulating layer 130*s* and the cell insulating layer 132. In an implementation, after the gate stack structure 120 is formed by stacking the cell insulating layer 132 and the gate electrode 130, the through portion CHH may be formed, and the gate dielectric layer 150, the channel layer 140, and the core insulating layer 142 may be formed therein. Even when using this manufacturing method, the carbon-containing layer 152*f* may be formed by using a plasma assisted doping process in a process of forming the first tunneling layer 152*a*.

In an implementation, the tunneling layer 152 adjacent to the channel layer 140 and including a carbon-containing layer 152*f* including an electric field concentration layer may be stably formed through a simple process.

In an implementation, the base tunneling layer 152*s* may be doped with carbon using a plasma assisted doping process to form the carbon-containing layer 152*f*. In an implementation, the carbon-containing layer 152*f* may be on the second tunneling layer 152*b* by using a deposition process of depositing a carbon-containing layer instead of the processes illustrated in FIG. 5B and FIG. 5C. In an implementation, it is also possible to form the carbon-containing layer 152*f* using an atomic layer deposition process. According to the atomic layer deposition process, the first tunneling layer 152*a* including the carbon-containing layer 152*f* may be formed by performing the atomic layer deposition process while providing a carbon supply material without using a separate device. Accordingly, the process of forming the first tunneling layer 152*a* or the carbon-containing layer 152*f* may be performed as a continuous process in the same equipment as that of the second tunneling layer 152*b* and/or the third tunneling layer 152*c*.

Further, in the above-described embodiment, in the plasma assisted doping process, in the embodiment, an entire thickness of the base tunneling layer 152*s* may be doped with carbon to entirely change the base tunneling layer 152*s* to the carbon-containing layer 152*f*. Accordingly, the first tunneling layer 152*a* may have a single-layer structure including the carbon-containing layer 152*f*.

Figure 8B:
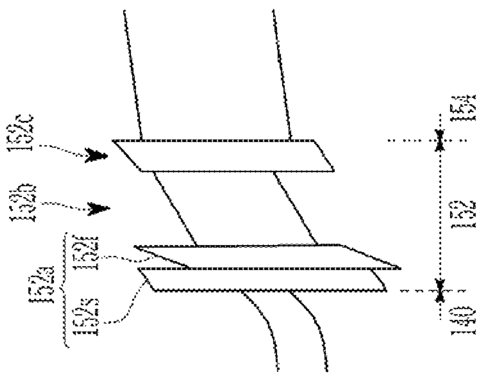
FIG. 8A and FIG. 8B illustrates a partial cross-sectional view and an energy band diagram showing a semiconductor device according to another embodiment.
Figure 8A:
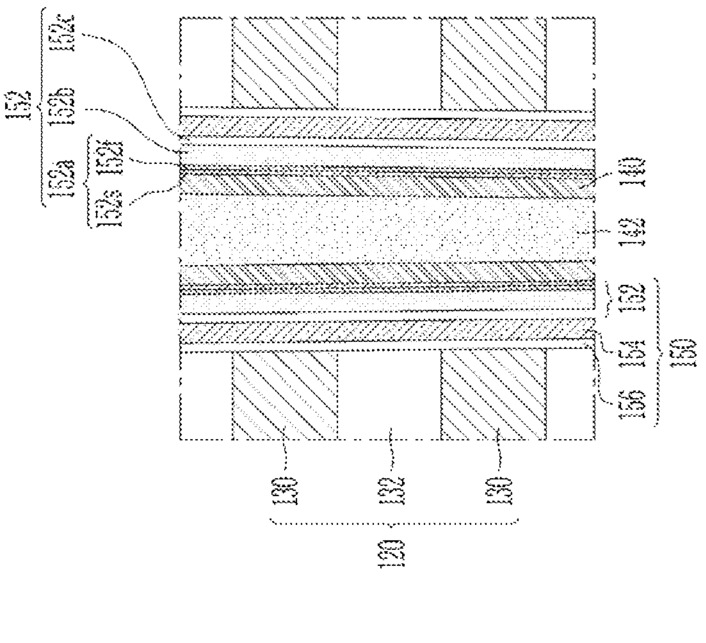
Figure 9B:
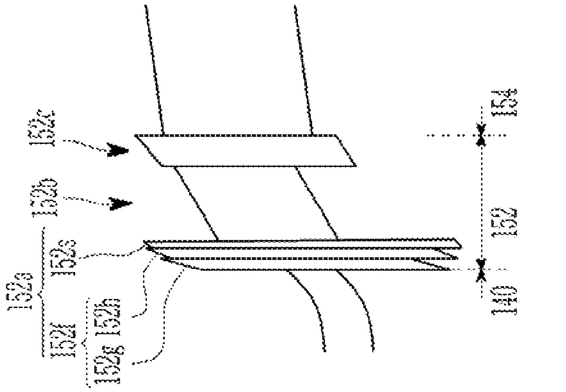
FIG. 9A and FIG. 9B illustrates a partial cross-sectional view and an energy band diagram showing a semiconductor device according to another embodiment.
Figure 9A:
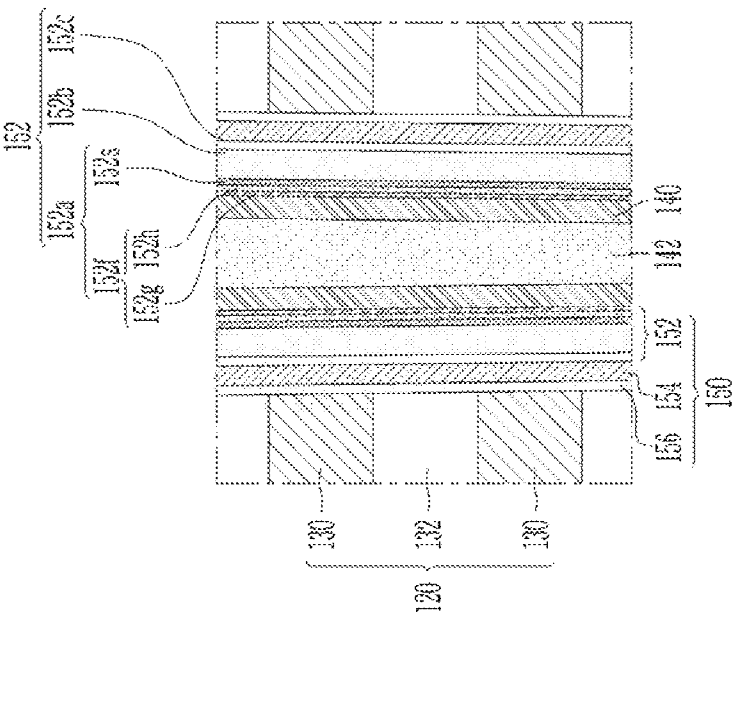

A semiconductor device according to various embodiments will be described in more detail with reference to FIG. 7A to FIG. 9B. Detailed descriptions of parts identical to or extremely similar to those already described will be omitted, and only other parts will be described in detail. FIG. 7A, FIG. 8A, and FIG. 9A illustrate portions of a semiconductor device corresponding to FIG. 7B, FIG. 8B, and FIG. 9B illustrate energy band diagrams of the semiconductor device in a state where an erasing voltage is applied.

Figure 7B:
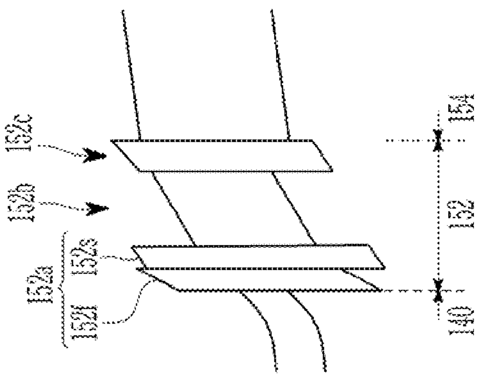
FIG. 7A and FIG. 7B illustrates a partial cross-sectional view and an energy band diagram showing a semiconductor device according to another embodiment.
Figure 7A:
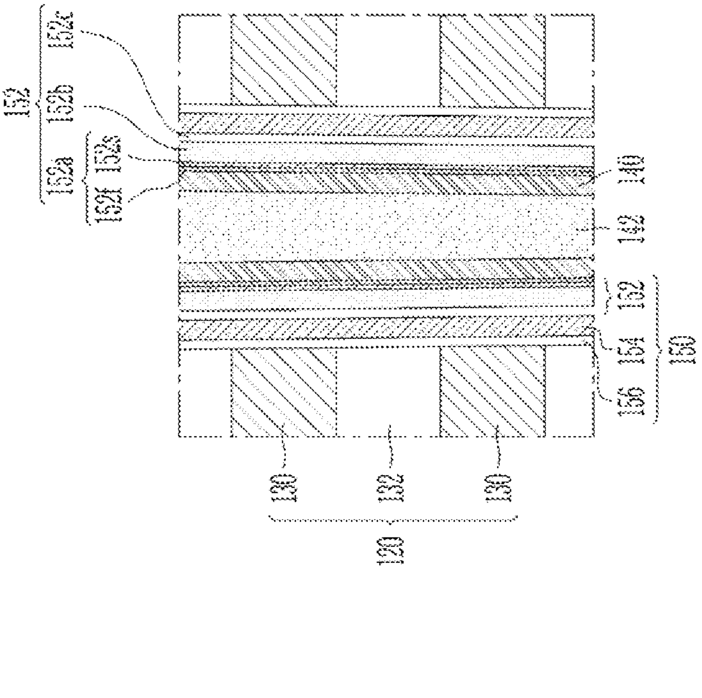

FIGS. 7A and 7B illustrate a partial cross-sectional view and an energy band diagram showing a semiconductor device according to another embodiment.

Referring to FIGS. 7A and 7B, in the semiconductor device according to the embodiment, the first tunneling layer 152*a* may include the carbon-containing layer 152*f* and the base tunneling layer 152*s*. In an implementation, the carbon-containing layer 152*f* may constitute only a portion of the first tunneling layer 152*a* (closer to the channel layer 140 than to the charge storage layer 154).

In an implementation, the base tunneling layer 152*s* may be formed of a layer that is based on a same material as that of the carbon-containing layer 152*f* but is not doped with carbon. In an implementation, the base tunneling layer 152*s* may be formed of a silicon oxide layer including a silicon oxide, e.g., a hydrogenated silicon oxide ($SiO_x$:H).

The carbon-containing layer 152*f* may be adjacent to (e.g., in contact with) the channel layer 140, and the base tunneling layer 152*s* may be adjacent to (e.g., in contact with) the second tunneling layer 152*b*. In an implementation, when the energy bandgap is relatively small and an electric field is applied at a portion adjacent to the channel layer 140, the carbon-containing layer 152*f* forming a wide FN tunneling region is positioned so that charge tunneling may easily occur. In an implementation, the base tunneling layer 152*s* may be adjacent to the second tunneling layer 152*b*, and it is possible to prevent the carbon included in the carbon-containing layer 152*f* from undesirably affecting the second tunneling layer 152*b*.

In an implementation, a thickness of the carbon-containing layer 152*f* may be greater than that of the base tunneling layer 152*s*. Then, an effect of the carbon-containing layer 152*f* may be fully implemented. In an implementation, the thickness of the carbon-containing layer 152*f* may be equal to or smaller than that of the base tunneling layer 152*s*.

In an implementation, a portion of the base tunneling layer 152*s* in the thickness direction may be doped with carbon to form the carbon-containing layer 152*f* to form the first tunneling layer 152 having the above structure. In an implementation, in the initially formed base tunneling layer 152*s*, a carbon-nondoped remaining portion and a carbon-doped portion may constitute the base tunneling layer 152*s* and the carbon-containing layer 152*f* of the first tunneling layer 152*a*, respectively. In an implementation, in the plasma assisted doping process described with reference to FIG. 5B, FIG. 5C, and FIG. 6, the first tunneling layer 152*a* having the above-described structure may be formed by doping carbon with only a portion of the thickness of the base tunneling layer 152*s*. Accordingly, the carbon-containing layer 152*f* may be doped with carbon at a desired doping concentration and a doping depth.

In an implementation, the first tunneling layer 152*a* having the above structure may be formed by sequentially forming the base tunneling layer 152*s* and the carbon-containing layer 152*f* by an atomic layer deposition process. In this case, the base tunneling layer 152*s* and the carbon-containing layer 152*f* may be formed in a continuous process using a same device, thereby simplifying the manufacturing process.

FIGS. 8A and 8B illustrate a partial cross-sectional view and an energy band diagram showing a semiconductor device according to another embodiment.

Referring to FIGS. 8A and 8B, in the semiconductor device according to the embodiment, the first tunneling layer 152*a* may include the carbon-containing layer 152*f* and the base tunneling layer 152*s*. In an implementation, the carbon-containing layer 152*f* may constitute only a portion of the first tunneling layer 152*a* (which is positioned closer to the channel layer 140 than the charge storage layer 154).

In this case, the base tunneling layer 152*s* may be adjacent to (e.g., in contact with) the channel layer 140, and the carbon-containing layer 152*f* may be adjacent to (e.g., in contact with) the second tunneling layer 152*b*. In an implementation, the base tunneling layer 152*s* may be adjacent to the channel layer 140, interface characteristics between the channel layer 140 and the first tunneling layer 152*a* may be improved, and storage stability may be improved. In an implementation, when an energy bandgap is relatively small and an electric field is applied, tunneling of charges may be facilitated through the carbon-containing layer 152*f* forming the wide FN tunneling region.

In an implementation, a thickness of the carbon-containing layer 152*f* may be greater than that of the base tunneling layer 152*s*. Then, an effect of the carbon-containing layer 152*f* may be fully implemented. In an implementation, the thickness of the carbon-containing layer 152*f* may be equal to or smaller than that of the base tunneling layer 152*s*.

In an implementation, after forming a silicon oxide layer, carbon may be doped to form a carbon-containing layer 152*f*, and then another silicon oxide layer may be additionally formed to form the first tunneling layer 152 having the above structure. In this case, another silicon oxide layer may constitute the base tunneling layer 152*s*. In an implementation, a plasma assisted doping process may be used for doping carbon. Accordingly, the carbon-containing layer

152*f* may be doped with carbon at a desired doping concentration and a doping depth.

In an implementation, the first tunneling layer 152*a* having the above structure may be formed by sequentially forming the carbon-containing layer 152*f* and the base tunneling layer 152*s* by an atomic layer deposition process. In this case, the carbon-containing layer 152*f* and the base tunneling layer 152*s* may be formed in a continuous process using a same device, thereby simplifying the manufacturing process.

FIGS. 7A and 7B and FIGS. 8A and 8B illustrate that the base tunneling layer 152*s* may be on a surface of the carbon-containing layer 152*f*. In an implementation, the base tunneling layer 152*s* may be at opposite sides of the carbon-containing layer 152*f*. In an implementation, the carbon-containing layer 152*f* may be positioned at opposite sides of the base tunneling layer 152*s*.

FIGS. 9A and 9B illustrate a partial cross-sectional view and an energy band diagram schematically showing a semiconductor device according to another embodiment.

Referring to FIGS. 9A and 9B, in the semiconductor device according to the embodiment, the carbon-containing layer 152*f* on the first tunneling layer 152*a* may include a first carbon-containing layer 152*g* and a second carbon-containing layer 152*h* having different compositions. In an implementation, it is different from the embodiments of FIG. 3, FIG. 7, and FIG. 8 in which the carbon-containing layer 152*f* is formed of a single layer having a single composition.

In an implementation, the first carbon-containing layer 152*g* and the second carbon-containing layer 152*h* may have different carbon contents. In an implementation, a carbon content of the first carbon-containing layer 152*g* closer or proximate to the channel layer 140 may be greater than a carbon content of the second carbon-containing layer 152*h* closer or proximate to the second tunneling layer 152*b*. In an implementation, the first carbon-containing layer 152*g* having a larger FN tunneling region may be closer to the channel layer 140, and the first carbon-containing layer 152*g* and the second carbon-containing layer 152*h* may be positioned such that an energy band gap gradually increases from the channel layer 140 toward the second tunneling layer 152*b*. Accordingly, charge tunneling may be performed more smoothly.

In an implementation, a base tunneling layer 152*s* may be further included between the carbon-containing layer 152*f* and the second tunneling layer 152*b*. Then, the first carbon-containing layer 152*g*, the second carbon-containing layer 152*h*, and the base tunneling layer 152*s* may be disposed such that the energy band gap gradually increases from the channel layer 140 toward the second tunneling layer 152*b*.

In an implementation, the base tunneling layer 152*s* may be between the channel layer 140 and the carbon-containing layer 152*f*. In an implementation, the base tunneling layer 152*s* may be at opposite sides of the carbon-containing layer 152*f*. In an implementation, the carbon-containing layer 152*f* may be at opposite sides of the base tunneling layer 152*s*. In an implementation, at least one of the carbon-containing layers 152*f* at opposite sides of the base tunneling layer 152*s* may include a plurality of carbon-containing layers 152*g* and 152*h* as illustrated in FIG. 9A, and the other may include a single-layer carbon-containing layer 152*f* as illustrated in FIG. 3, FIG. 7A, and FIG. 8A, or may include the carbon-containing layers 152*g* and 152*h* as illustrated in FIG. 9A. When the plurality of carbon-containing layers 152*g* and 152*h* are positioned at opposite sides of the base tunneling layer 152*s*, the number and composition of the carbon-containing layers 152*g* and 152*h* at opposite sides may be the same or different.

In an implementation, a thickness of the carbon-containing layer 152*f* may be greater than that of the base tunneling layer 152*s*. In an implementation, the carbon-containing layer 152*f* may include a plurality of layers, may be stably formed, and an effect of the carbon-containing layer 152*f* may be sufficiently implemented. In an implementation, the thickness of the carbon-containing layer 152*f* may be smaller than that of the base tunneling layer 152*s*.

In an implementation, the carbon-containing layer 152*f* may include two layers having different compositions (e.g., different carbon contents). In an implementation, the carbon-containing layer 152*f* may include three or more layers having different compositions (e.g., different carbon contents). In an implementation, the carbon content of the carbon-containing layer 152*f* may decrease or increase gradually or stepwise in a direction from the channel layer 140 toward the second tunneling layer 152*b*.

In an implementation, the carbon-containing layer 152*f* including a plurality of layers may be formed using a plasma assisted doping process, or may be formed by changing process conditions in an atomic layer deposition process.

Hereinafter, Experimental Examples will be described with reference to FIG. 10. The Experimental Examples are only presented as examples.

In semiconductor devices according to Experimental Examples 1 and 2, the first tunneling layer included a carbon-containing layer made of silicon oxycarbide. A carbon content of the carbon-containing layer according to Experimental Example 2 was greater than that of the carbon-containing layer according to Experimental Example 1. In the semiconductor device according to a Comparative Example, the first tunneling layer was formed of a silicon oxide that did not include carbon. The Comparative Example had a same structure as Experimental Example 1 and 2 except for a first tunneling layer.

Figure 10:
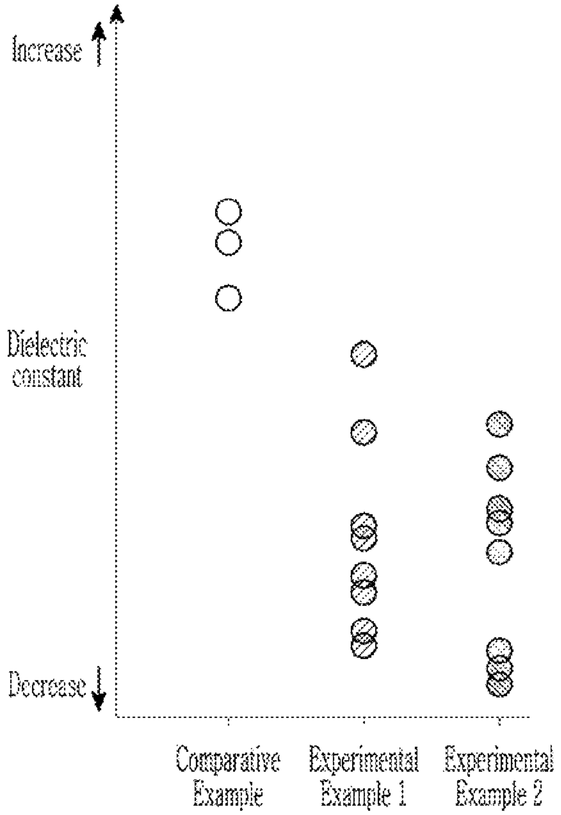
FIG. 10 illustrates a graph showing permittivity of a first tunneling layer in semiconductor devices according to Experimental Examples 1 and 2 and a Comparative Example.

A dielectric constant of the first tunneling layer was measured in the semiconductor devices according to Experimental Examples 1 and 2 and the Comparative Example, and results thereof are illustrated in FIG. 10.

Referring to FIG. 10, it may be seen that the first tunneling layer (i.e., the carbon-containing layer) according to Experimental Examples 1 and 2 had a lower dielectric constant than that of the first tunneling layer according to the Comparative Example. In this case, the first tunneling layer (i.e., the carbon-containing layer) according to Experimental Example 2 having a relatively higher carbon content than that of the first tunneling layer (i.e., the carbon-containing layer) according to Experimental Example 1 had a lower dielectric constant. Accordingly, it may be seen that the carbon-containing layer formed of the silicon oxide layer had a lower dielectric constant than that of the silicon oxide layer. As such, when the first tunneling layer included a silicon oxycarbide layer having a low dielectric constant, it may be more affected by an electric field, and thus the energy level may be more deformed by the electric field.

Figure 11:
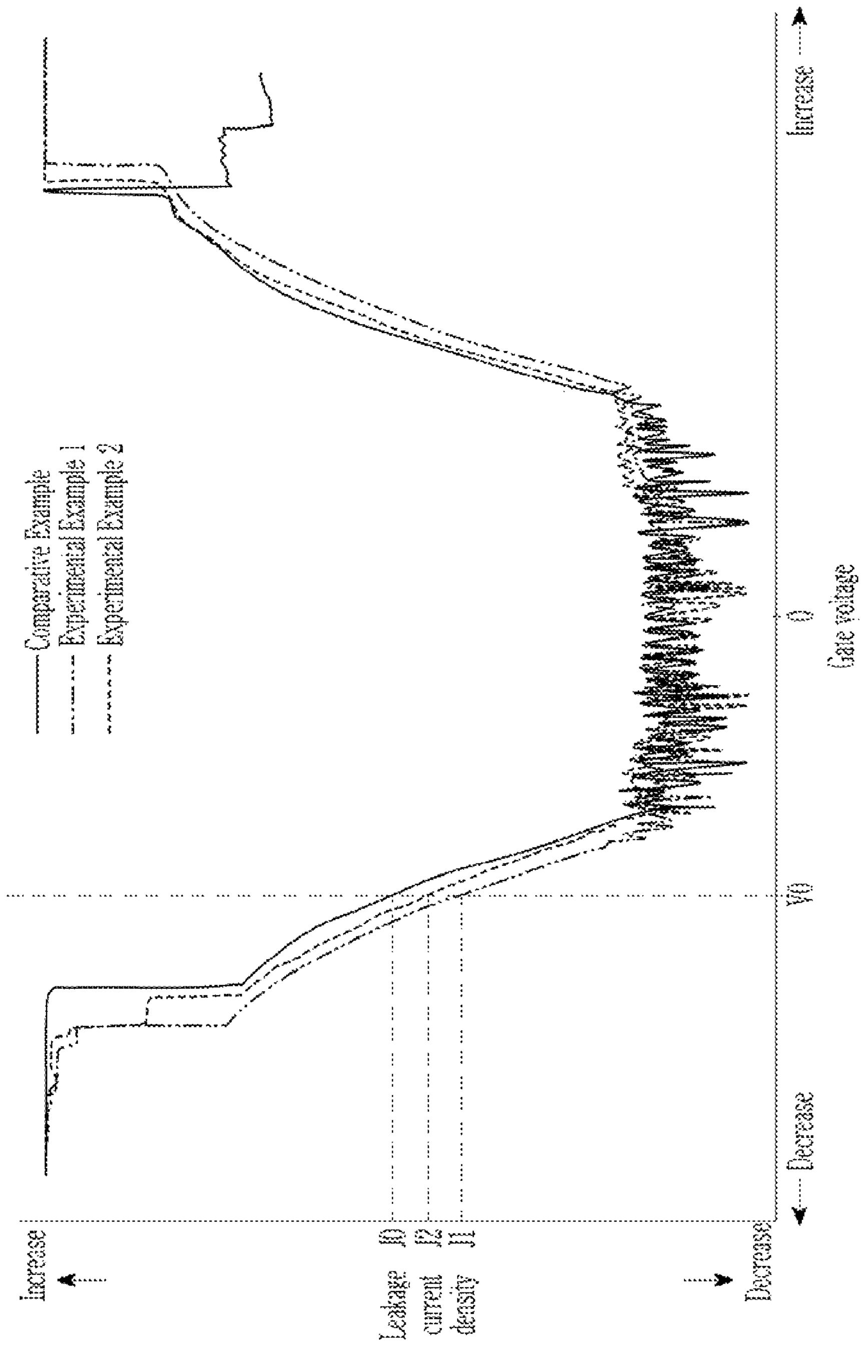
FIG. 11 illustrates a graph showing leakage current density depending on voltages in semiconductor devices according to Experimental Examples 1 and 2 and a Comparative Example.

In the semiconductor devices according to Experimental Examples 1 and 2 and the Comparative Example, leakage current density (Jg) was measured while changing a gate voltage, and results thereof are shown in FIG. 11. Herein, a value shown on an X-axis of FIG. 11 increases when the gate voltage increases, and decreases when the gate voltage decreases.

Referring to FIG. 11, the semiconductor devices according to Experimental Examples 1 and 2 had relatively low leakage current densities J1 and J2 at the gate voltage V0 at which the erasing operation occurs, whereas the semiconductor device according to the Comparative Example had a high leakage current density value J0 at a gate voltage V0 at which the erasing operation occurs. Accordingly, as in Experimental Examples 1 and 2, it can be seen that a leakage current may be reduced when a carbon-containing layer made of a silicon oxycarbide layer was included in the first tunneling layer.

Figure 12A:
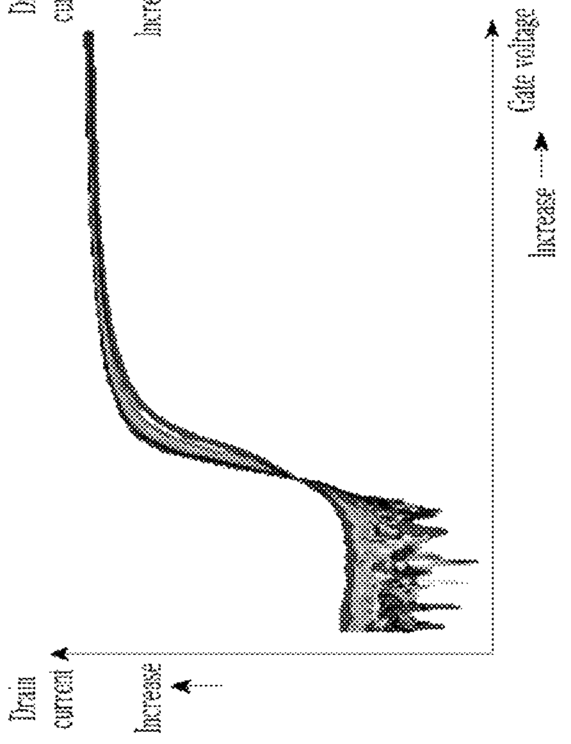
FIG. 12A and FIG. 12B illustrates a graph showing a drain current depending on a gate voltage in a semiconductor device after 10,000 cycles of operation according to Experimental Example 1 and a Comparative Example.
Figure 12B:
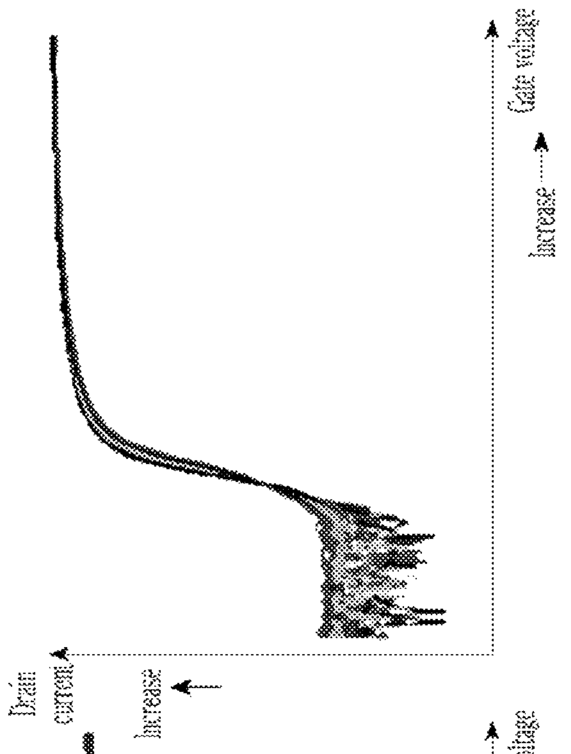

After 10,000 cycles of operation, in the semiconductor device according to the Comparative Example and Experimental Example 1, a drain current according to the gate voltage was measured and results thereof are illustrated in FIGS. 12A and 12B. FIGS. 12A and 12B illustrate values measured in a plurality of memory cells together, and from the results illustrated in FIGS. 12A and 12B, a median value of subthreshold swing is calculated.

FIG. 12A shows the result of the semiconductor device according to the Comparative Example, and FIG. 12B shows the result of the semiconductor device according to Experimental Example 1.

Referring to FIG. 12A, it may be seen that in the semiconductor device according to the Comparative Example, a current did not increase rapidly with an increase in voltage, resulting in a large dispersion. On the other hand, referring to FIG. 12B, in the semiconductor device according to Experimental Example 1, it may be seen that the overall current increased rapidly as the voltage increased. When the median value of the subthreshold swing in the semiconductor device according to Comparative Example was 100, a subthreshold swing value of the semiconductor device according to Experimental Example 1 corresponded to 52. Accordingly, as in Experimental Example 1, it may be seen that durability of the semiconductor device may be improved when a carbon-containing layer made of a silicon oxycarbide layer is included in the first tunneling layer.

Figure 13:
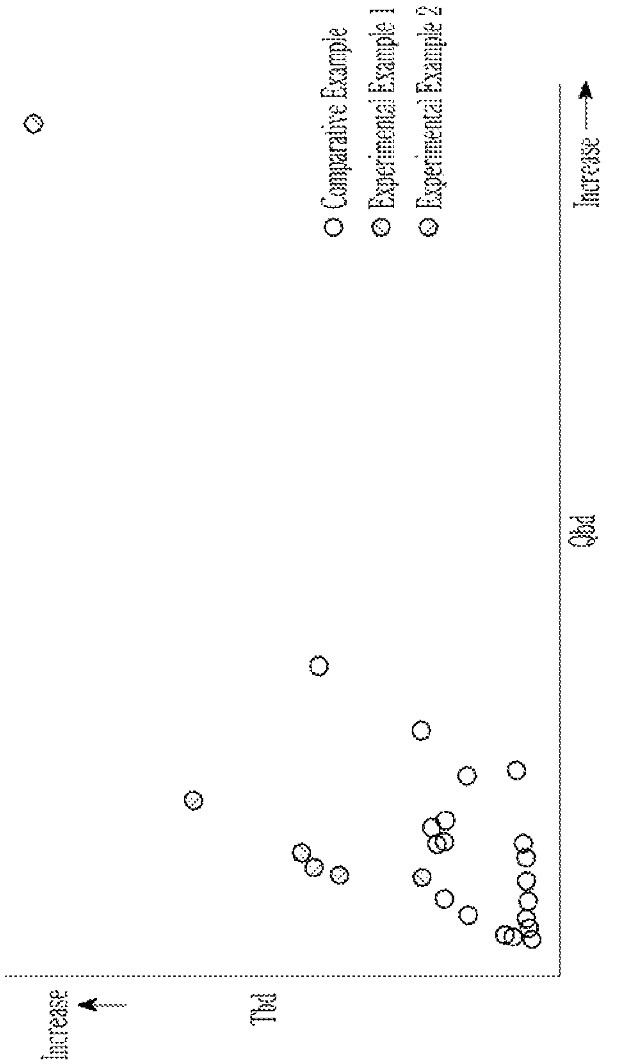
FIG. 13 illustrates a graph showing a breakdown time (Tbd) according to a total charge amount (Qbd) of breakdown in semiconductor devices according to a Comparative Example and Experimental Examples 1 and 2.

In the semiconductor devices according to the Comparative Example and Experimental Examples 1 and 2, a breakdown time (Tbd) to a total charge amount (Qbd) of breakdown occurs was measured, and results thereof are illustrated in FIG. 13.

Referring to FIG. 13, it may be seen that a breakdown time in a total charge amount where same breakdown occurs was greater in the semiconductor device according to Experimental Examples 1 and 2 than in the semiconductor device according to the Comparative Example. Accordingly, as in Experimental Examples 1 and 2, it may be seen that the breakdown time may be increased when the carbon-containing layer made of the silicon oxycarbide layer is included in the first tunneling layer.

In the above description, it has been exemplified that the gate contact portion 184 extends through the cell insulating layer 132 to reach the gate electrode 130 and to be connected to the gate electrode 130 in the connecting region 104. In an implementation, the gate contact portion 184 may extend through the cell insulating layer 132 and the gate electrode 130, and extend to the first wire portion 230 in the circuit region 200. In this case, the gate contact portion 184 may include a pad corresponding to the gate electrode 130 to be connected among the gate electrodes 130 included in the gate stack structure 120, and may be insulated from the other gate electrode 130 with an insulating material.

Figure 14:
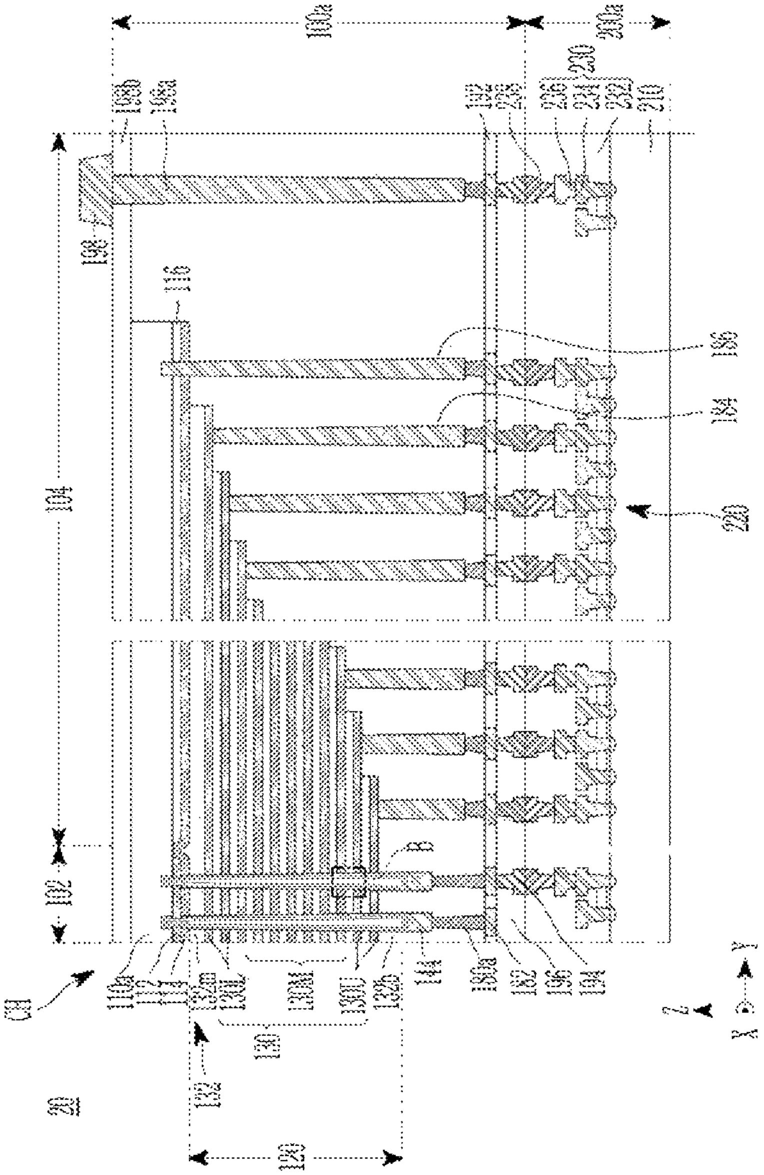
FIG. 14 illustrates a partial cross-sectional view schematically showing a semiconductor device according to an additional embodiment.
Figure 15:
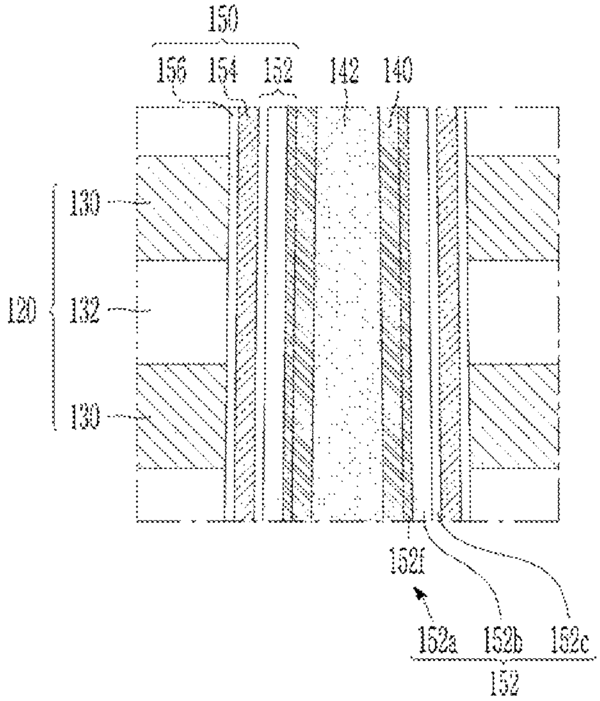
FIG. 15 illustrates an enlarged partial cross-sectional view of a portion B of FIG. 14.

An additional embodiment different from the above-described embodiment will be described in detail with reference to FIG. 14 and FIG. 15. In FIG. 14 and FIG. 15, descriptions with reference to FIG. 1 to FIG. 9 may be applied as they are except where otherwise indicated for same or similar reference numerals as in FIG. 1 to FIG. 9. Hereinafter, a description will be given mainly of parts different from the description in the embodiment with reference to FIG. 1 to FIG. 9.

FIG. 14 illustrates a partial cross-sectional view schematically showing a semiconductor device according to an additional embodiment, and FIG. 15 illustrates an enlarged partial cross-sectional view of a portion B of FIG. 14.

Referring to FIG. 14 and FIG. 15, the semiconductor device 20 according to the embodiment may have a chip to chip (C2C) structure bonded by a wafer bonding method. In an implementation, after manufacturing a lower chip including a circuit region 200*a* positioned on the first substrate 210 and manufacturing the upper chip including a cell region 100*a* on a second substrate 110*a*, the semiconductor device 20 may be manufactured by joining them together.

The circuit region 200*a* may have a first junction structure 238 on a surface facing the cell region 100*a* on the first substrate 210, the circuit element 220, and the first wire portion 230.

The cell region 100*a* may include a second junction structure 194 on a surface facing the circuit region 200*a* on the second substrate 110, the gate stack structure 120, the channel structure CH, and the second wire portion 180.

The second substrate 110*a* may be a semiconductor substrate including a semiconductor material. In an implementation, the second substrate 110*a* may be a semiconductor substrate made of a semiconductor material or may be a semiconductor substrate on which a semiconductor layer is formed on a base substrate. In an implementation, the second substrate 110*a* may be formed of single crystal or polycrystalline silicon, germanium, silicon-germanium, silicon-on-insulator, or germanium-on-insulator.

In the gate stack structure 120, the gate electrode 130 may include the lower gate electrode 130L, the memory cell gate electrode 130M, and the upper gate electrode 130U sequentially on the second substrate 110*a* toward the circuit region 200*a* from the second substrate 110*a*. In an implementation, as illustrated in FIG. 14 and FIG. 15, the gate stack structure 120 may be sequentially stacked on a lower portion of the second substrate 110*a* in the drawing, and thus the gate stack structure 120 illustrated in FIG. 1 to FIG. 3 may be positioned in a vertically inverted manner.

In an implementation, the channel pad 144 and the second wire portion 180 on the gate stack structure 120 may be adjacent to the circuit region 200*a*. In an implementation, the second junction structure 194 electrically connected to the second wire portion 180 may be on a surface facing the circuit region 200*a*. A region other than the second junction structure 194 may be covered by an insulating layer 196. In an implementation, in the cell region 100*a*, the second wire portion 180 and the second junction structure 194 may face the circuit region 200*a*.

In an implementation, the first junction structure 238 or the second junction structure 194 and the first junction structure 238 of the circuit region 200*a* may be made of aluminum, copper, tungsten, or an alloy including the same. In an implementation, the first and second junction structures 238 and 194 may include copper, and the cell region 100*a* and the circuit region 200*a* may be bonded by copper-to-copper bonding (directly contacted and bonded).

In an implementation, as illustrated in FIG. 14, the gate stack structure 120 may be formed of a single gate stack structure. In an implementation, as illustrated in FIG. 1, a plurality of gate stack structures may be included. Except as otherwise described, descriptions of the structures of the gate stack structure 120 and the channel structure CH described with reference to FIG. 1 to FIG. 9 may be applied as they are. In FIG. 14, a same electrical connection structure between the channel structure CH and the horizontal conductive layers 112 and 114 or the second substrate 110 as in FIG. 1 is illustrated. In an implementation, an electrical connection structure between the channel structure CH and the horizontal conductive layers 112 and 114 or the second substrate 110 may be variously modified.

The semiconductor device 20 according to an example may include an input/output pad 198 and an input and output connecting wire 198*a* electrically connected thereto. The input and output connecting wire 198*a* may be electrically connected to a portion of the second junction structure 194. The input/output pad 198 may be on, e.g., an insulating layer 198*b* covering an outer surface of the second substrate 110*a*. In an implementation, a separate input and output pad electrically connected to the circuit region 200*a* may be provided.

Figure 16:
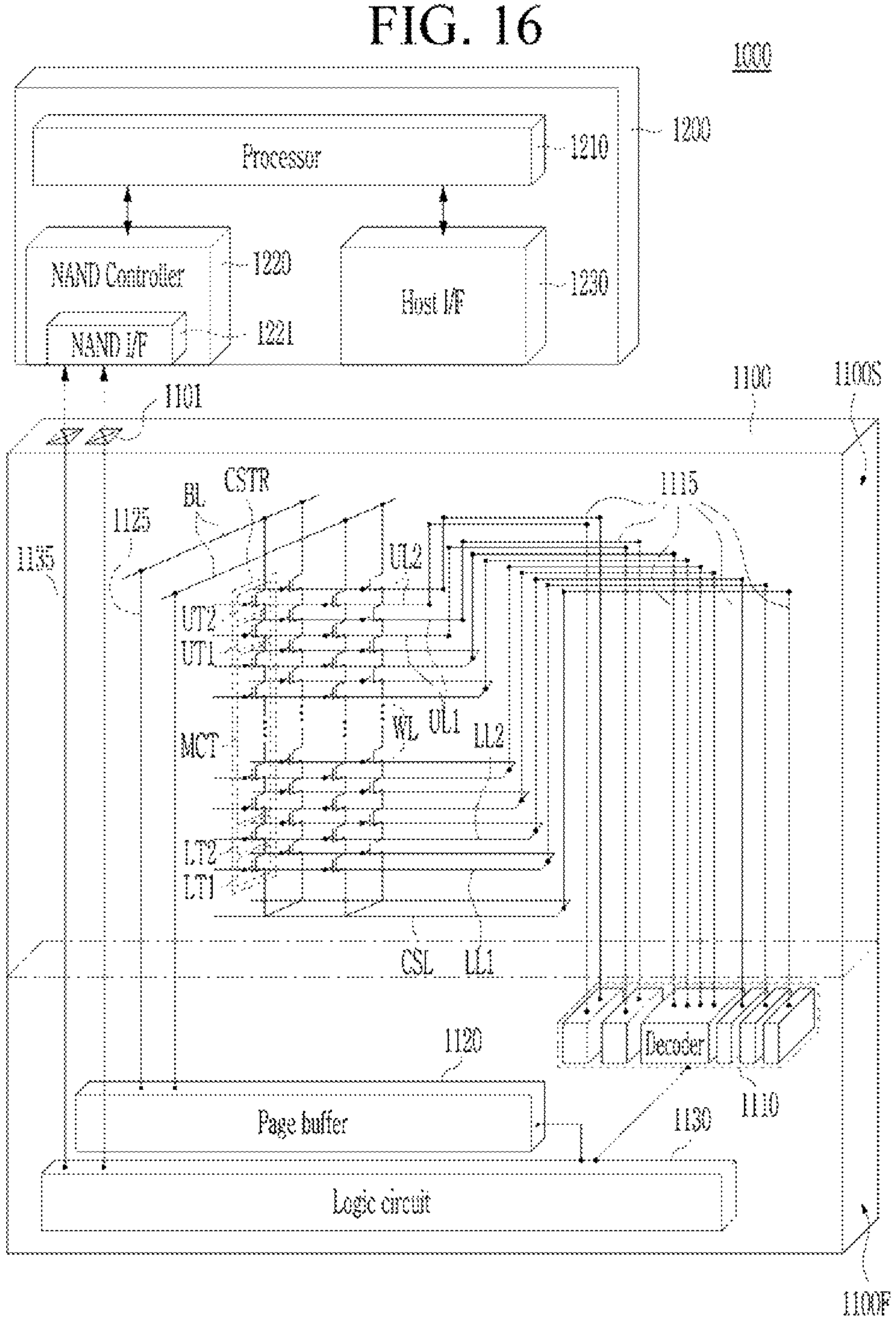
FIG. 16 schematically illustrates an electronic system including a semiconductor device according to an embodiment.

In an implementation, the circuit region 200*a* and the cell region 100*a* may respectively be portions corresponding to a first structure 1100F and a second structure 1100S of a semiconductor device 1100 included in an electronic system 1000 illustrated in FIG. 16. In an implementation, the circuit region 200*a* and the cell region 100*a* may be regions including a first structure 4400 and a second structure 4200 of a semiconductor chip 2200*a* illustrated in FIG. 19, respectively.

An example of an electronic system including the aforementioned semiconductor device will be described in detail.

FIG. 16 schematically illustrates an electronic system including a semiconductor device according to an embodiment.

Referring to FIG. 16, the electronic system 1000 according to an embodiment may include a semiconductor device 1100 and a controller 1200 electrically connected to the semiconductor device 1100. The electronic system 1000 may be a storage device including one or a plurality of semiconductor devices 1100 or an electronic device including the storage device. In an implementation, the electronic system 1000 may be a solid state drive (SSD) device including one or the plurality of semiconductor devices 1100, a universal serial bus (USB), a computing system, a medical device, or a communication device.

The semiconductor device 1100 may be a non-volatile memory device, and may be, e.g., a NAND flash memory device described with reference to FIG. 1 to FIG. 15.

The semiconductor device 1100 may include a first structure 1100F and a second structure 1100S on the first structure 1100F. In an implementation, the first structure 1100F may be next to the second structure 1100S. The first structure 1100F may be a peripheral circuit structure including a decoder circuit 1110, a page buffer 1120, and a logic circuit 1130. The second structure 1100S may be a memory cell structure including a bitline BL, a common source line CSL, a word line WL, first and second gate upper lines UL1 and UL2, and first and second gate lower lines LL1 and LL2, and a memory cell string CSTR between the bitline BL and the common source line CSL.

In the second structure 1100S, each memory cell string CSTR may include lower transistors LT1 and LT2 adjacent to the common source line CSL, upper transistors UT1 and UT2 adjacent to the bitline BL, and a plurality of memory cell transistors MCT between the lower transistors LT1 and LT2 and the upper transistors UT1 and UT2. A number of lower transistors LT1 and LT2 and a number of upper transistors UT1 and UT2 may be variously modified according to another embodiment.

In an implementation, the lower transistors LT1 and LT2 may include ground selective transistors, and the upper transistors UT1 and UT2 may include string selective transistors. The first and second gate lower lines LL1 and LL2 may be gate electrodes of the lower transistors LT1 and LT2, respectively. The word line WL may be a gate electrode of the memory cell transistor MCT, and the gate upper lines UL1 and UL2 may be gate electrodes of the upper transistors UT1 and UT2, respectively.

The common source line CSL, the first and second gate lower lines LL1 and LL2, the word line WL, and the first and second gate upper lines UL1 and UL2 may be electrically connected to the decoder circuit 1110 through a first connecting wire 1115 extending from the first structure 1100F to the second structure 1100S. The bitline BL may be electrically connected to the page buffer 1120 through a second connecting wire 1125 extending to the second structure 1100S in the first structure 1100F.

In the first structure 1100F, the decoder circuit 1110 and the page buffer 1120 may execute a control operation on at least one memory cell transistor selected from among the memory cell transistors MCT. The decoder circuit 1110 and the page buffer 1120 may be controlled by the logic circuit 1130. The semiconductor device 1100 may communicate with the controller 1200 through an input and output pad 1101 electrically connected to the logic circuit 1130. The input and output pad 1101 may be electrically connected to the logic circuit 1130 through an input and output connecting wire 1135 extending from the first structure 1100F to the second structure 1100S.

The controller 1200 may include a processor 1210, a NAND controller 1220, and a host interface 1230. In an implementation, the electronic system 1000 may include a plurality of semiconductor devices 1100, and in this case, the controller 1200 may control the semiconductor devices 1100.

The processor 1210 may control an overall operation of the electronic system 1000 including the controller 1200. The processor 1210 may operate according to predetermined firmware, and may access the semiconductor devices 1100 by controlling the NAND controller 1220. The NAND controller 1220 may include a NAND interface 1221 that processes communication with the semiconductor devices 1100. A control command for controlling the semiconductor device 1100, data to be recorded in the memory cell transistor MCT of the semiconductor device 1100, and data to be read from the memory cell transistor MCT of the semiconductor device 1100 may be transmitted through the NAND interface 1221. The host interface 1230 may provide a communication function between the electronic system 1000 and an external host. When a control command is received from an external host through the host interface 1230, the processor 1210 may control the semiconductor devices 1100 in response to the control command.

Figure 17:
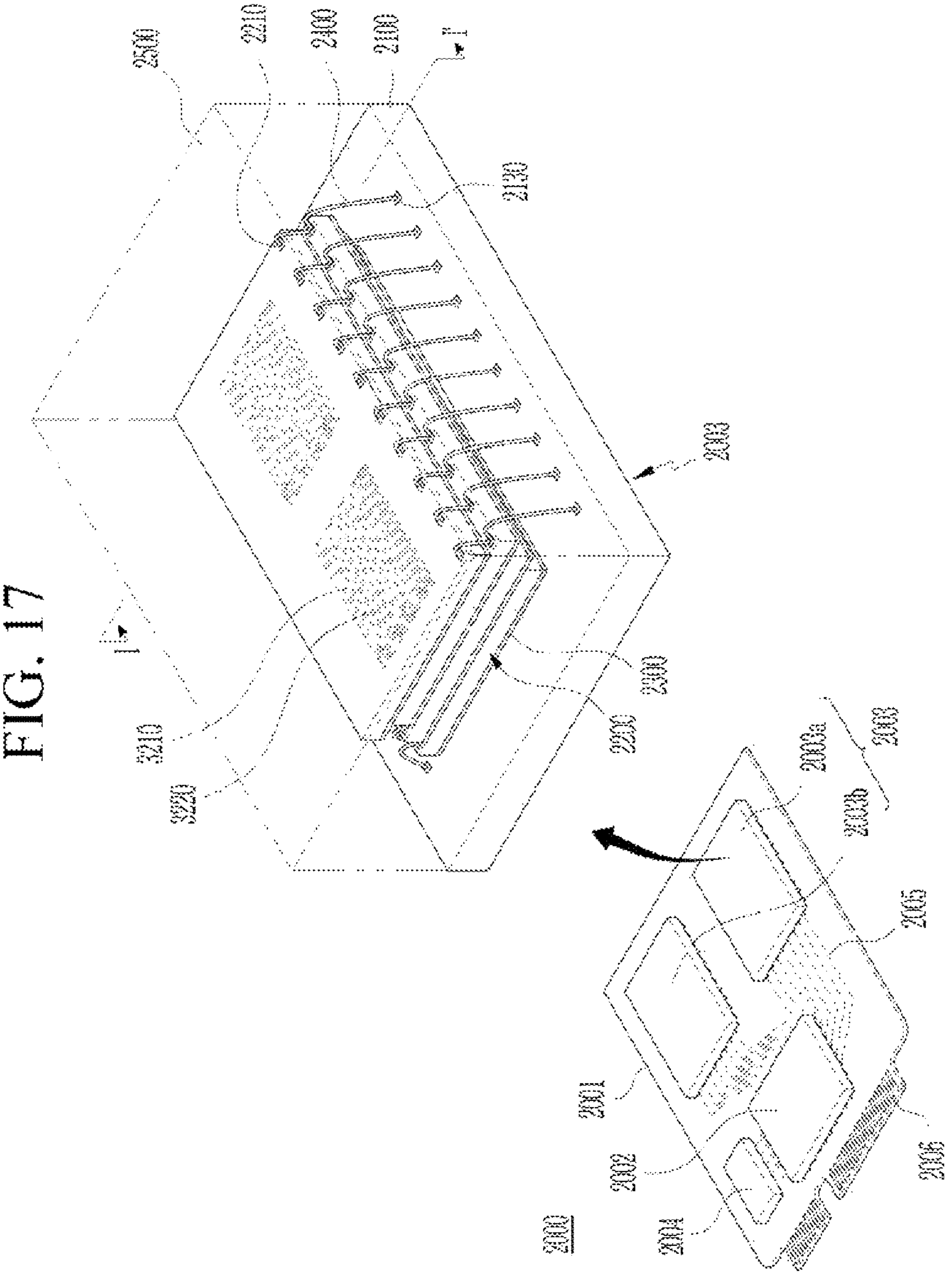
FIG. 17 illustrates a schematic perspective view showing an electronic system including a semiconductor device according to an embodiment.

FIG. 17 illustrates a schematic perspective view showing an electronic system including a semiconductor device according to an embodiment.

Referring to FIG. 17, an electronic system 2000 according to an embodiment includes a main substrate 2001, a controller 2002 mounted on the main substrate 2001, at least one semiconductor package 2003, and a DRAM 2004. The semiconductor package 2003 and the DRAM 2004 may be connected to the controller 2002 through a wire pattern 2005 positioned on the main substrate 2001.

The main substrate 2001 may include a connector 2006 including a plurality of pins coupled to an external host. A number and disposition of the pins in the connector 2006 may vary depending on a communication interface between the electronic system 2000 and the external host. In an implementation, the electronic system 2000 may communicate with the external host according to any one of interfaces such as a universal flash storage (USB), a peripheral component interconnect express (PCI-Express), a serial advanced technology attachment (SATA), M-Phy for universal flash storage (UFS), or the like. In an implementation, the electronic system 2000 may operate with power supplied from an external host through the connector 2006. The electronic system 2000 may further include a power management integrated circuit (PMIC) that distributes power supplied from the external host to the controller 2002 and semiconductor package 2003.

The controller 2002 may record data in the semiconductor package 2003, or may read data from the semiconductor package 2003, and may improve an operation speed of the electronic system 2000.

The DRAM 2004 may be a buffer memory for buffering a speed difference between the semiconductor package 2003, which is a data storage space, and an external host. The DRAM 2004 included in the electronic system 2000 may also operate as a kind of cache memory, and may provide a space for temporarily storing data in the control operation for the semiconductor package 2003. When the electronic system 2000 includes the DRAM 2004, the controller 2002 may further include a DRAM controller for controlling the DRAM 2004 in addition to the NAND controller for controlling the semiconductor package 2003.

The semiconductor package 2003 may include first and second semiconductor packages 2003*a* and 2003*b* spaced apart from each other. The first and second semiconductor packages 2003*a* and 2003*b* may be semiconductor packages each including a plurality of semiconductor chips 2200. Each of the first and second semiconductor packages 2003*a* and 2003*b* may include a package substrate 2100, a semiconductor chip 2200 on the package substrate 2100, an adhesive layer 2300 disposed on a lower surface of each semiconductor chip 2200, a connecting structure 2400 that electrically connects the semiconductor chip 2200 and the package substrate 2100, and a molding layer 2500 covering the semiconductor chip 2200 and the connecting structure 2400 on the package substrate 2100.

The package substrate 2100 may be a printed circuit board including a package upper pad 2130. Each semiconductor chip 2200 may include an input and output pad 2210. The input and output pad 2210 may correspond to the input and output pad 1101 of FIG. 16. Each semiconductor chip 2200 may include a gate stack structure 3210 and a channel structure 3220. The semiconductor chip 2200 may include the semiconductor device described with reference to FIG. 1 to FIG. 15.

In an implementation, the connecting structure 2400 may be a bonding wire electrically connecting the input and output pad 2210 and the package upper pad 2130. In an implementation, the semiconductor chips 2200 may be electrically connected to each other by using a bonded wire method, and may be electrically connected to the package upper pad 2130 of the package substrate 2100 in each of the first and second semiconductor packages 2003*a* and 2003*b*. In an implementation, the semiconductor chips 2200 may be electrically connected to each other by a connecting structure including a through silicon via (TSV) instead of the bonding wire connecting structure 2400 in each of the first and second semiconductor packages 2003*a* and 2003*b*.

In an implementation, the controller 2002 and the semiconductor chip 2200 may be included in one package. In an implementation, the controller 2002 and the semiconductor chip 2200 may be mounted on a separate interposer substrate that is different from the main substrate 2001, and the controller 2002 and the semiconductor chip 2200 may be connected to each other by a wire positioned on the interposer substrate.

Figure 18:
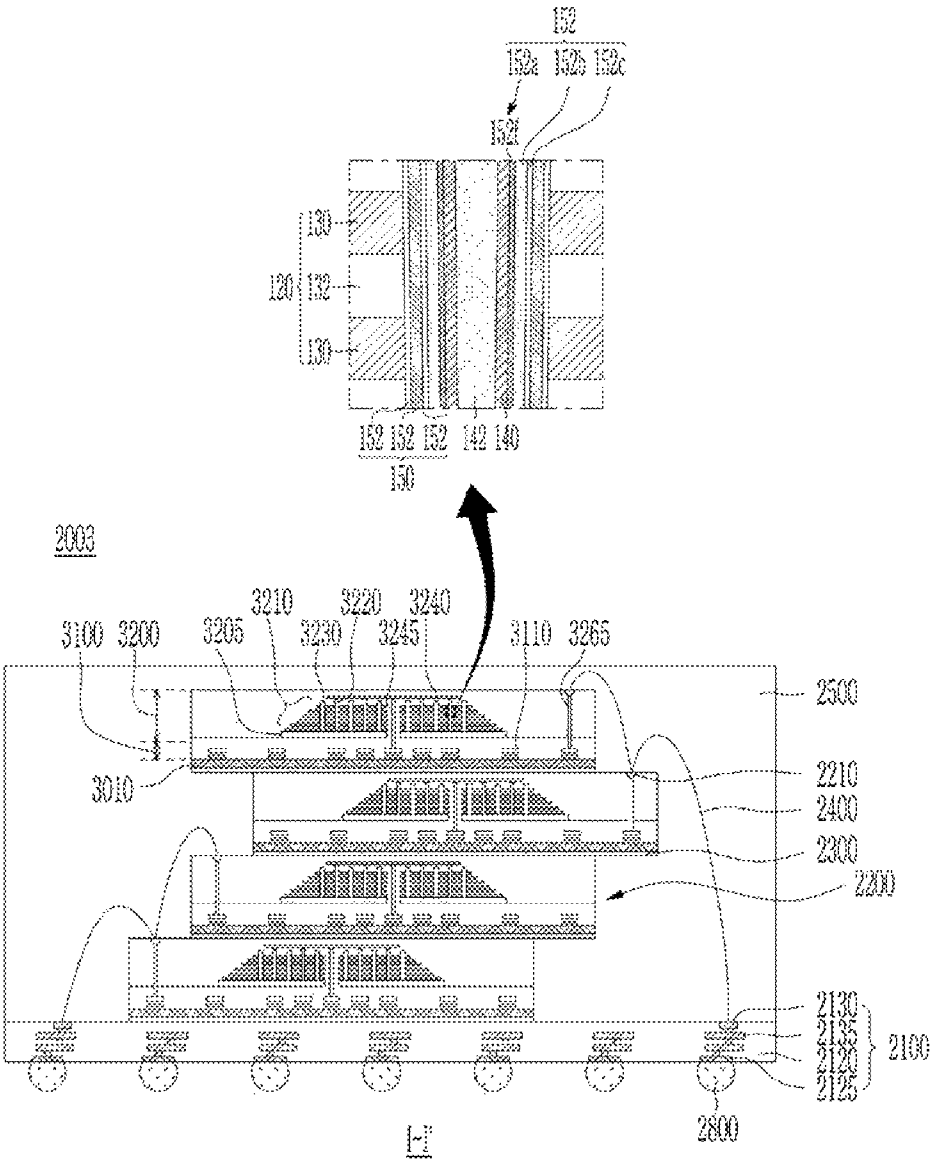
FIG. 18 illustrates a schematic cross-sectional view of a semiconductor package according to an embodiment.
Figure 19:
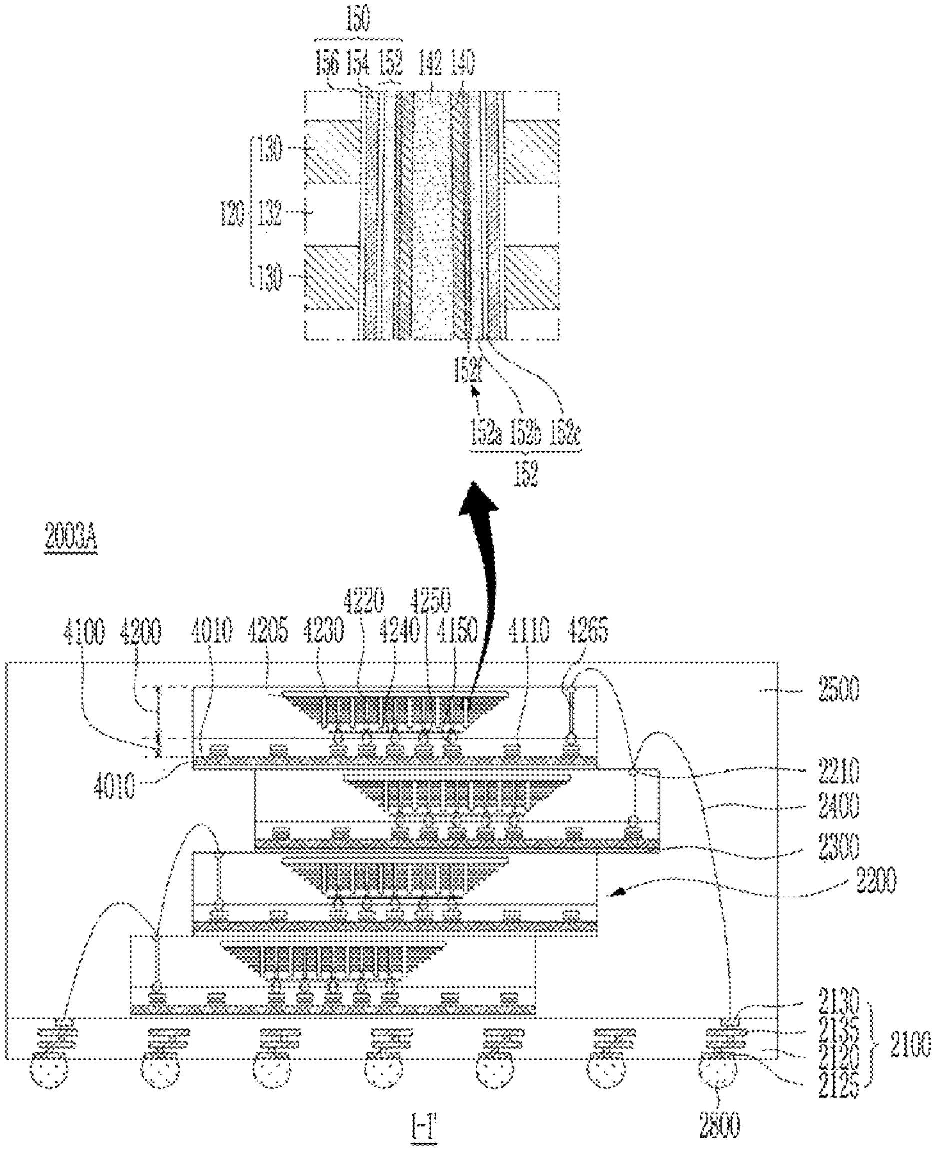
FIG. 19 illustrates a schematic cross-sectional view of a semiconductor package according to an embodiment.

FIG. 18 and FIG. 19 each illustrate a schematic cross-sectional view showing a semiconductor package according to an embodiment. FIG. 18 and FIG. 19 each illustrate an embodiment of the semiconductor package 2003 of FIG. 17, and conceptually illustrates an area of the semiconductor package 2003 of FIG. 17 taken along a line I-I'.

Referring to FIG. 18, in the semiconductor package 2003, the package substrate 2100 may be a printed circuit board. The package substrate 2100 may include a package substrate body 2120, a package upper pad 2130 on an upper surface of the package substrate body 2120, a lower pad 2125 on a surface of the package substrate body 2120, and an inner wire 2135 that electrically connects the package upper pad 2130 and the lower pad 2125 inside the package substrate body 2120. The package upper pad 2130 may be electrically connected to the connecting structure 2400. The lower pad 2125 may be connected to the wire pattern 2005 of the main substrate 2010 of the electronic system 2000 through a conductive connector 2800 as illustrated in FIG. 17.

The semiconductor chip 2200 may each include a semiconductor substrate 3010, and a first structure 3100 and a second structure 3200 stacked in turn on the semiconductor substrate 3010. The first structure 3100 may include a peripheral circuit region including a peripheral wire 3110. The second structure 3200 may include a common source line 3205, a gate stack structure 3210 on the common source line 3205, a channel structure 3220 and a separating structure 3230 through the gate stack structure 3210, a bitline 3240 electrically connected to the channel structure 3220, and a gate connecting wire electrically connected to a word line (reference sign WL of FIG. 16) of the gate stack structure 3210.

In an implementation, in the semiconductor chip 2200 or the semiconductor device, the tunneling layer 152 may have an excellent operation speed, durability, and reliability by having the carbon-containing layer 152*f* in a portion adjacent to the channel layer 140.

Each of the semiconductor chips 2200 may include a through wire 3245 that is electrically connected to the peripheral wire 3110 of the first structure 3100 and extends into the second structure 3200. The through wire 3245 may extend through the gate stack structure 3210, and may be further positioned outside the gate stack structure 3210. Each semiconductor chip 2200 may further include an input and output connecting wire 3265 electrically connected to the peripheral wire 3110 of the first structure 3100 and an input and output pad 2210 electrically connected to the input and output connecting wire 3265 extending into the second structure 3200.

In an implementation, a plurality of semiconductor chips 2200 in the semiconductor package 2003 may be electrically connected to each other by a connecting structure 2400 having a form of a bonding wire. In an implementation, the semiconductor chips 2200 or a plurality of portions constituting the semiconductor chips 2200 may be electrically connected by a connecting structure including a through silicon via (TSV).

Referring to FIG. 19, in a semiconductor package 2003A, each semiconductor chip 2200*a* may include a semiconductor substrate 4010, a first structure 4100 on the semiconductor substrate 4010, and a second structure 4200 bonded to a first structure 4100 by wafer bonding on the first structure 4100.

The first structure 4100 may include a peripheral circuit region including a peripheral wire 4110 and a first junction structure 4150. The second structure 4200 may include a common source line 4205, a gate stack structure 4210 between the common source line 4205 and the first structure 4100, a channel structure 4220 and a separating structure 4230 extending through the gate stack structure 4210, and a second junction structure 4250 electrically connected to the word line (reference numeral WL in FIG. 16, hereinafter the same) of each of the channel structure 4220 and the gate stack structure 4210. In an implementation, the second junction structure 4250 may be electrically connected to the channel structure 4220 and the word line WL through a bit line 4240 electrically connected to the channel structure 4220 and a gate connecting wire electrically connected to the word line WL, respectively. The first junction structure 4150 of the first structure 4100 and the second junction structure 4250 of the second structure 4200 may be bonded while contacting each other. A bonded portion of the first junction structure 4150 and the second junction structure 4250 may be formed of, e.g., copper (Cu).

In an implementation, in the semiconductor chip 2200*a* or the semiconductor device, the tunneling layer 152 may have an excellent operation speed, durability, and reliability by having the carbon-containing layer 152*f* in a portion adjacent to the channel layer 140.

Each of the semiconductor chips 2200*a* may further include an input and output pad 2210 and an input and output connecting wire 4265 under the input and output pad 2210. The input and output connecting wire 4265 may be electrically connected to a portion of the second junction structure 4250.

In an implementation, a plurality of semiconductor chips 2200 in the semiconductor package 2003 may be electrically connected to each other by a connecting structure 2400 having a form of a bonding wire. In an implementation, the semiconductor chips 2200 or a plurality of portions constituting the semiconductor chips 2200 may be electrically connected by a connecting structure including the through silicon via (TSV).

One or more embodiments may provide a semiconductor device capable of improving an operating speed, durability, and reliability.

According to an embodiment, the carbon-containing layer having a relatively low dielectric constant may include carbon at a portion that is adjacent to the channel layer rather than the charge storage layer in the tunneling layer and functioning as an electric field concentration layer may be provided, thereby facilitating charge tunneling. Accordingly, the operation speed and durability may be improved. In this case, the carbon-containing layer may be made of a silicon oxycarbide, and thus reliability may be improved by increasing a breakdown voltage and reducing a leakage current.

In accordance with the manufacturing method of the semiconductor device according to the embodiment, the above-described tunneling layer including the carbon-containing layer may be stably formed through a simple process. Herein, when a carbon-containing layer is formed using a plasma assisted doping process, carbon may be doped to have a desired doping concentration and a doping depth.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:

a substrate;

a stack structure including an interlayer insulating layer and a gate electrode which are alternately stacked on the substrate;

a channel layer extending in a direction crossing the substrate through the stack structure; and a gate dielectric layer between the gate electrode and the channel layer, the gate dielectric layer including a tunneling layer, a charge storage layer, and a blocking layer sequentially on the channel layer, wherein:

the tunneling layer includes a carbon-containing layer comprising a dielectric material that includes carbon, and the carbon-containing layer is positioned closer to the channel layer than to the charge storage layer.

2. The semiconductor device of claim 1, wherein the carbon-containing layer includes an electric field concentrating layer having a dielectric constant that is lower than that of silicon oxide.

3. The semiconductor device of claim 1, wherein the carbon-containing layer includes a silicon oxycarbide (SiOC) including silicon, oxygen, and carbon.

4. The semiconductor device of claim 3, wherein the carbon-containing layer includes hydrogenated silicon oxycarbide (SiOC:H).

5. The semiconductor device of claim 1, wherein the carbon-containing layer includes 0.2 at % to 10 at % of carbon.

6. The semiconductor device of claim 1, wherein a thickness of the carbon-containing layer is 5 nm or less.

7. The semiconductor device of claim 1, wherein:

the tunneling layer includes a first tunneling layer on the channel layer and a second tunneling layer on the first tunneling layer, the second tunneling layer having a thickness greater than a thickness of the first tunneling layer, and the carbon-containing layer constitutes only a part of the first tunneling layer or all of the first tunneling layer.

8. The semiconductor device of claim 7, wherein the first tunneling layer has a single layer structure such that the carbon-containing layer constitutes all of the first tunneling layer.

9. The semiconductor device of claim 7, wherein the first tunneling layer further includes a base tunneling layer including a silicon oxide in a space between the channel layer and the carbon-containing layer or in a space between the carbon-containing layer and the second tunneling layer.

10. The semiconductor device of claim 7, wherein:

the second tunneling layer has a bandgap energy that is smaller than a bandgap energy of the first tunneling layer, and the second tunneling layer has a dielectric constant that is higher than a dielectric constant of the first tunneling layer.

11. The semiconductor device of claim 10, wherein the second tunneling layer includes a silicon oxynitride (SiON).

12. The semiconductor device of claim 1, wherein the carbon-containing layer includes a single layer or a plurality of layers having different compositions.

13. The semiconductor device of claim 12, wherein the carbon-containing layer includes a first carbon-containing layer adjacent to the channel layer and a second carbon-containing layer on the first carbon-containing layer, the second carbon-containing layer having a carbon content that is lower than a carbon content of the first carbon-containing layer.

14. An electronic system, comprising:

a main substrate;

a semiconductor device on the main substrate; and a controller electrically connected to the semiconductor device on the main substrate, wherein:

the semiconductor device includes a circuit region including a peripheral circuit structure on a first substrate and a cell region including a memory cell structure on a second substrate, the cell region includes a stack structure including an interlayer insulating layer and a gate electrode which are alternately stacked on the second substrate, a channel layer extending through the stack structure and extending in a direction crossing the second substrate, and a gate dielectric layer between the gate electrode and the channel layer to include a tunneling layer, a charge storage layer, and a blocking layer sequentially disposed on the channel layer, and the tunneling layer includes a carbon-containing layer comprising a dielectric material that includes carbon, the carbon-containing layer being closer to the channel layer than to the charge storage layer.

15. The electronic system of claim 14, wherein the carbon-containing layer includes an electric field concentrating layer having a dielectric constant that is lower than that of silicon oxide.

16. The electronic system of claim 14, wherein the carbon-containing layer includes a silicon oxycarbide including silicon, oxygen, and carbon.

17. A method of manufacturing a semiconductor device including a stack structure including an interlayer insulating layer and a gate electrode which are alternately stacked on a substrate, a channel layer extending through the stack structure and extending in a direction crossing the substrate, and a gate dielectric layer between the gate electrode and the channel layer, the gate dielectric layer including a tunneling layer, a charge storage layer, and a blocking layer sequentially on the channel layer, the method comprising:

forming the tunneling layer such that the tunneling layer includes forming a carbon-containing layer comprising a dielectric material that includes carbon such that the carbon-containing layer is closer to the channel layer than to the charge storage layer.

18. The method of claim 17, wherein:

forming the carbon-containing layer includes forming a base tunneling layer made of a silicon oxide, and doping all or part of the base tunneling layer with carbon; or forming the carbon-containing layer includes performing a deposition process of depositing a layer including carbon.

19. The method of claim 17, wherein forming the carbon-containing layer includes performing a plasma assisted doping process or an atomic layer deposition process.

20. The method of claim 17, wherein the carbon-containing layer includes a silicon oxycarbide including silicon, oxygen, and carbon.

* * * * *